United States Patent
Omoto

(10) Patent No.: US 8,866,718 B2
(45) Date of Patent: Oct. 21, 2014

(54) DRIVE CIRCUIT AND DISPLAY DEVICE

(75) Inventor: Keisuke Omoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 454 days.

(21) Appl. No.: 12/972,743

(22) Filed: Dec. 20, 2010

(65) Prior Publication Data

US 2011/0157119 A1    Jun. 30, 2011

(30) Foreign Application Priority Data

Dec. 25, 2009    (JP) .................................. 2009-295550

(51) Int. Cl.
*G09G 3/36* (2006.01)
*G09G 3/30* (2006.01)
*G09G 3/32* (2006.01)
*G09G 3/20* (2006.01)
*H01L 51/50* (2006.01)

(52) U.S. Cl.
CPC .. *G09G 3/20* (2013.01); *G09G 3/30* (2013.01); *G09G 3/32* (2013.01); *H01L 51/50* (2013.01)
USPC ............................................. 345/98; 345/76

(58) Field of Classification Search
USPC ............................................. 345/98, 76, 204
See application file for complete search history.

(56) References Cited

U.S. PATENT DOCUMENTS

| 4,384,287 | A  | * | 5/1983 | Sakuma ........................... 345/60 |
| 6,081,131 | A  | * | 6/2000 | Ishii ................................. 326/68 |
| 2003/0001832 | A1 | * | 1/2003 | Yamazaki et al. ............. 345/204 |
| 2011/0157117 | A1 |   | 6/2011 | Omoto et al. |
| 2011/0157118 | A1 |   | 6/2011 | Omoto et al. |
| 2011/0234567 | A1 | * | 9/2011 | Omoto ........................... 345/211 |

FOREIGN PATENT DOCUMENTS

JP    2008-083272    4/2008

* cited by examiner

*Primary Examiner* — Kevin M Nguyen
(74) *Attorney, Agent, or Firm* — Wolf, Greenfield & Sacks, P.C.

(57) ABSTRACT

The present invention provides a drive circuit and a display device realizing reduced variations in both a trailing timing and a rising timing of output voltage. The drive circuit includes an input-side inverter circuit and an output-side inverter circuit connected to each other in series and inserted between a high-voltage line and a low-voltage line. The output-side inverter circuit includes: a first transistor having a drain connected to the high-voltage line side and a source connected to an output side of the output-side inverter circuit; a second transistor having a drain connected to the low-voltage line side and a source connected to an output side of the output-side inverter circuit; and a correction circuit correcting gate voltage of the first and second transistors.

5 Claims, 18 Drawing Sheets

DRIVE CIRCUIT AND DISPLAY DEVICE

BACKGROUND OF THE INVENTION

1. Field of the Invention

The present invention relates to a drive circuit suitably applicable to a display device using, for example, an organic EL (Electro Luminescence) element. More particularly, the invention relates to a display device having the drive circuit.

2. Description of the Related Art

In recent years, in the field of a display device for displaying an image, a display device using, as a light emitting element of a pixel, an optical element of a current driving type whose light emission luminance changes according to the value of a flowing current, for example, an organic EL element is developed and is being commercialized. An organic EL element is a self-luminous element different from a liquid crystal element or the like. Consequently, in a display device using an organic EL element (organic EL display device), by controlling the value of current flowing in the organic EL element, tones of color are obtained.

Like a liquid crystal display, an organic EL display device has driving methods; a simple (passive) matrix method, and an active matrix method. The former method has, although the structure is simple, a disadvantage such that it is difficult to realize a large-size and high-resolution display device.

Consequently, at present, the active matrix method is actively developed. In the method, current flowing in a light emitting element disposed for each pixel is controlled by a drive transistor.

In the drive transistor, there is a case that a threshold voltage $V_{th}$ and mobility μ changes with time, or varies among pixels due to variations in manufacturing processes. In the case where the threshold voltage $V_{th}$ or mobility μ varies among pixels, the value of current flowing in the drive transistor varies among pixels. Consequently, even when the same voltage is applied to the gate of the drive transistor, the light emission luminance of the organic EL element varies, and uniformity of a screen deteriorates. Therefore, a display device having a function of correcting fluctuations in the threshold voltage $V_{th}$ or mobility μ is developed (see, for example, Japanese Unexamined Patent Application Publication No. 2008-083272).

Correction on fluctuations in the threshold voltage $V_{th}$ or mobility μ is performed by a pixel circuit disposed for each pixel. The pixel circuit includes, for example, as illustrated in FIG. 16, a drive transistor $Tr_1$ for controlling current flowing in an organic EL element 111, a write transistor $Tr_2$ for applying voltage of a signal line DTL to the drive transistor $Tr_1$, and a retention capacitor $C_s$, and has a circuit configuration of 2Tr1C. The drive transistor $Tr_1$ and the write transistor $Tr_2$ are, for example, thin film transistors (TFTs) of the n-channel MOS type.

FIG. 15 shows an example of the waveforms of voltages applied to the pixel circuit and an example of changes in gate voltage and source voltage of the drive transistor. (A) in FIG. 15 illustrates a state where a signal voltage $V_{sig}$ and an offset voltage $V_{ofs}$ are applied to the signal line DTL. (B) in FIG. 15 illustrates a state where a voltage $V_{dd}$ for turning on the drive transistor and a voltage $V_{ss}$ for turning off the drive transistor are applied to a write line WSL. (C) in FIG. 15 illustrates a state where a high voltage $V_{ccH}$ and a low voltage $V_{ccL}$ are applied to a power line PSL. Further, (D) and (E) in FIG. 15 illustrate a state where a gate voltage $V_g$ and a source voltage $V_s$ change momentarily in accordance with the voltage application to the power line PSL, the signal line DTL, and the write line WSL.

It is understood from FIG. 15 that a WS pulse P1 is applied to the write line WSL twice in 1 H, threshold correction is performed by the WS pulse P1 of the first time, and the mobility correction and signal writing is performed by the WS pulse P1 of the second time. That is, in FIG. 15, the WS pulse P1 is used not only for signal writing but also for the threshold correction and the mobility correction in the drive transistor $Tr_1$.

In the following, the threshold correction and the mobility correction in the drive transistor $T_{r1}$ will be described. By the application of the WS pulse P1 of the second time, the signal voltage $V_{sig}$ is applied to the gate of the drive transistor $T_{r1}$. Accordingly, the drive transistor $T_{r1}$ is turned on, and current flows in the drive transistor $T_{r1}$. When it is assumed that a reverse bias is applied to an organic EL element 111, charges flowed from the drive transistor $T_{r1}$ are accumulated in the retention capacitor $C_s$ and a device capacitor (not shown) of the organic EL element 111, and the source voltage Vs rises. In the case where the mobility of the drive transistor $T_{r1}$ is high, current flowing in the drive transistor $T_{r1}$ becomes large, so that the rise of the source voltage Vs is quickened. On the contrary, in the case where the mobility of the drive transistor $T_{r1}$ is low, current flowing in the drive transistor $T_{r1}$ becomes small, so that the rise of the source voltage Vs is slower than that in the case where the mobility of the drive transistor $T_{r1}$ is high. Therefore, by adjusting the period of correcting the mobility, the mobility is corrected.

SUMMARY OF THE INVENTION

In the display device of the active matrix method, each of a horizontal drive circuit for driving a signal line and a write scan circuit for sequentially selecting pixels basically includes a shift register (not shown) and has a buffer circuit stage by stage in correspondence with each of columns or rows of pixels. For example, a buffer circuit in a scan circuit is configured by connecting two inverter circuits 210 and 220 in series as illustrated in FIG. 17. In a buffer circuit 200 of FIG. 17, each of the inverter circuits 210 and 220 has a circuit configuration that a MOS transistor of the p-channel type and a MOS transistor of the n-channel type are connected in parallel. The buffer circuit 200 is inserted between a high-voltage line $L_H$ to which high-level voltage is applied and a low-voltage line $L_L$ to which low-level voltage is applied.

In the buffer circuit 200, however, for example, as illustrated in FIG. 18, when a threshold voltage $V_{th1}$ of the MOS transistor of the p-channel type varies only by $\Delta V_{th1}$, the rising timing of the voltage $V_{out}$ of an output OUT shifts only by $\Delta_{t1}$. In the buffer circuit 200, for example, as illustrated in FIG. 18, when a threshold voltage $V_{th2}$ of the MOS transistor of the n-channel type varies only by $\Delta V_{th2}$, the trailing timing of the voltage $V_{out}$ of the output OUT shifts only by $\Delta_{t2}$. Therefore, for example, in the case where the rising timing and the trailing timing of the voltage $V_{out}$ of the output OUT vary and a mobility correction period $\Delta T$ varies only by $\Delta_{t1} + \Delta_{t2}$, for example, as illustrated in FIG. 19, current $I_{ds}$ at the time of light emission varies only by $\Delta I_{ds}$, and there is a shortcoming such that the variation causes variation in luminance. FIG. 19 illustrates an example of the relation between the mobility correction period $\Delta T$ and the light emission luminance.

The variations in the threshold voltage $V_{th}$ occurs not only in the scan circuit of a display device but also in other devices.

It is therefore desirable to provide a drive circuit realizing reduced variations in both of a rising timing and a trailing timing of output voltage and a display device having the drive circuit.

A drive circuit according to an embodiment of the invention includes an input-side inverter circuit and an output-side inverter circuit connected to each other in series and inserted between a high-voltage line and a low-voltage line. The output-side inverter circuit includes: a first transistor having a drain connected to the high-voltage line side and a source connected to an output side of the output-side inverter circuit; and a second transistor having a drain connected to the low-voltage line side and a source connected to an output side of the output-side inverter circuit. The output-side inverter circuit further has a correction circuit for correcting gate voltage of the first and second transistors.

A display device according to an embodiment of the invention has a display section including a plurality of scan lines disposed in rows, a plurality of signal lines disposed in columns, and a plurality of pixels disposed in a matrix; and a drive section for driving the pixels. The drive section has a plurality of drive circuits provided for the scan lines in a one-to-one corresponding manner, and each of the drive circuits in the drive section includes the same components as those of the above-described drive circuit.

In the drive circuit and the display device of embodiments of the invention, a correction circuit for correcting gate voltage of the first and second transistors, is assembled in the output-side inverter out of the input-side inverter circuit and the output-side inverter circuit connected to each other in series. With the configuration, for the gate of the first transistor, a threshold voltage of the first transistor or a voltage corresponding to the threshold voltage of the first transistor is set as an offset voltage to the first transistor. For a gate of the second transistor, a threshold voltage of the second transistor or a voltage corresponding to the threshold voltage of the second transistor is set as an offset voltage to the second transistor.

According to the drive circuit and the display device of embodiments of the invention, the threshold voltage or a voltage corresponding to the threshold voltage is set as an offset voltage for the gate of each of the first and second transistors. With the configuration, variations are reduced at both of a trailing timing and a rising timing of the output voltage of the drive circuit. Therefore, for example, in an organic EL display device, variations in the current flowing in the organic EL element are reduced at the time of light emission, so that uniformity of luminance is improved.

Other and further objects, features and advantages of the invention will appear more fully from the following description.

DETAILED DESCRIPTION OF THE PREFERRED EMBODIMENTS

In the following, modes for carrying out the present invention will be described in detail hereinbelow with reference to the drawings. The description will be given in the following order.

Figure 1:
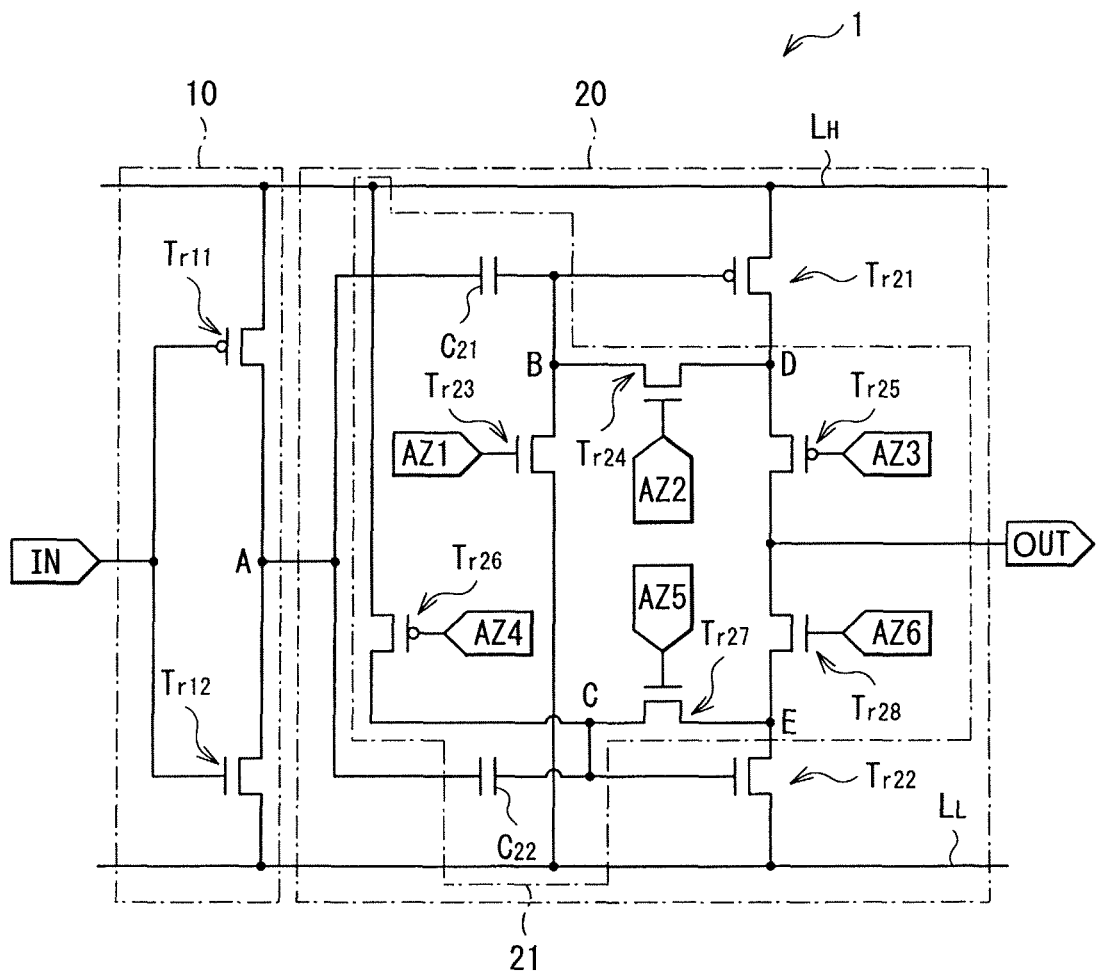
FIG. 1 is a circuit diagram illustrating an example of a buffer circuit according to a first embodiment of the present invention.

1. First embodiment (FIGS. 1 to 6)
2. Second embodiment (FIGS. 7 to 12)
3. Application example (FIGS. 13 to 15)
4. Description of related art (FIGS. 16 to 19)
First Embodiment
Configuration FIG. 1 expresses an example of a general configuration of a buffer circuit 1 (drive circuit) according to a first embodiment of the invention. The buffer circuit 1 outputs a pulse signal having a phase which is almost the same as that of a pulse signal input to an input terminal IN, from an output terminal OUT. The buffer circuit 1 has an inverter circuit 10 (input-side inverter circuit) and an inverter circuit 20 (output-side inverter circuit).

The inverter circuits 10 and 20 output a pulse signal obtained by almost inverting the waveform of an input pulse signal. The inverter circuits 10 and 20 are connected in series and inserted between a high-voltage line $L_H$ and a low-voltage line $L_L$. The inverter circuit 10 is disposed on the input terminal IN side in relation with the inverter circuit 20, and the input terminal of the inverter circuit 10 corresponds to the input terminal IN of the buffer circuit 1. On the other hand, the inverter circuit 20 is disposed on the output terminal OUT side in relation with the inverter circuit 10, and the output terminal of the inverter circuit 20 corresponds to the output terminal OUT of the buffer circuit 1. The output terminal (a part corresponding to A in the diagram) of the inverter circuit 10 is connected to the input terminal of the inverter circuit 20, and the buffer circuit 1 is constructed so that an output of the inverter circuit 10 is input to the inverter circuit 20.

The inverter circuit 10 has a transistor $Tr_{11}$ of a first conduction type and a transistor $Tr_{12}$ of a second conduction type. The transistor $Tr_{11}$ is, for example, a MOS (Metal Oxide Semiconductor) transistor of the p-channel type, and the transistor $Tr_{12}$ is, for example, a MOS transistor of the n-channel type.

The transistors $Tr_{11}$ and $Tr_{12}$ are connected to each other in parallel. Concretely, the gate of the transistor $Tr_{11}$ and the gate of the transistor $Tr_{12}$ are connected to each other. Further, the source or drain of the transistor $Tr_{11}$ and the source or drain of the transistor $Tr_{12}$ are connected to each other. The gate of the transistor $Tr_{11}$ and the gate of the transistor $Tr_{12}$ are connected to the input terminal of the inverter circuit 10 (the input terminal IN of the buffer circuit 1). A connection point A between the source or drain of the transistor $Tr_{11}$ and the source or drain of the transistor $Tr_{12}$ is connected to the output terminal of the inverter circuit 10. The source or drain of the transistor $Tr_{11}$, which is not connected to the transistor $Tr_{12}$, is connected to the high-voltage line $L_H$. On the other hand, the source or drain of the transistor $Tr_{12}$, which is not connected to the transistor $Tr_{11}$, is connected to the low-voltage line $L_L$. In the inverter circuit 10, any device may be provided between the transistors $Tr_{11}$ and $Tr_{12}$, between the transistor $Tr_{11}$ and the high-voltage line $L_H$, and between the transistor $Tr_{12}$ and the low-voltage line $L_L$.

The inverter circuit 20 has the transistor $Tr_{21}$ (first transistor) of the first conduction type and the transistor $Tr_{22}$ (second transistor) of a second conduction type. The transistor $Tr_{21}$ is, for example, a MOS (Metal Oxide Semiconductor) transistor of the p-channel type, and the transistor $Tr_{22}$ is, for example, a MOS transistor of the n-channel type.

The transistors $Tr_{21}$ and $Tr_{22}$ are connected to each other in parallel like the transistors $Tr_{11}$ and $Tr_{12}$. Concretely, the gate of the transistor $Tr_{21}$ and the gate of the transistor $Tr_{22}$ are connected to each other via capacitive elements $C_{21}$ and $C_{22}$ of a threshold correcting circuit 21 which will be described later. The gate of the transistor $Tr_{21}$ is connected to the input terminal of the inverter circuit 20 via the capacitive element $C_{21}$. The gate of the transistor $Tr_{22}$ is connected to the input terminal of the inverter circuit 20 via the capacitive element $C_{22}$. Further, the source or drain of the transistor $Tr_{21}$ and the source or drain of the transistor $Tr_{22}$ are connected to each other via transistors $Tr_{25}$ and $Tr_{28}$ of the threshold correcting circuit 21 which will be described later. The source or drain of the transistor $Tr_{21}$ is connected to the output terminal of the inverter circuit 20 (the output terminal OUT of the buffer circuit 1) via the transistor $Tr_{25}$. On the other hand, the source or drain of the transistor $Tr_{22}$ is connected to the output terminal of the inverter circuit 20 (the output terminal OUT of the buffer circuit 1) via the transistor $Tr_{28}$. The source or drain of the transistor $Tr_{21}$, which is not connected to the transistor $Tr_{25}$, is connected to the high-voltage line $L_H$. The source or drain of the transistor $Tr_{22}$, which is not connected to the transistor $Tr_{28}$, is connected to the low-voltage line $L_L$. In the inverter circuit 20, any device may be provided between the transistors $Tr_{21}$ and $Tr_{22}$, between the transistor $Tr_{21}$ and the high-voltage line $L_H$, and between the transistor $Tr_{22}$ and the low-voltage line $L_L$.

The inverter circuit 20 further includes the threshold correcting circuit 21 (correction circuit) for correcting the gate voltage Vg (not shown) of each of the transistors $Tr_{21}$ and $Tr_{22}$. Concretely, the threshold correcting circuit 21 sets, as an offset voltage, a voltage corresponding to a threshold voltage $V_{th1}$ (not illustrated) of the transistor $Tr_{21}$ or a threshold voltage $V_{th1}$ of the transistor $Tr_{21}$, for the gate of the transistor $Tr_{21}$. The threshold correcting circuit 21 also sets, as an offset voltage, a voltage corresponding to a threshold voltage $V_{th2}$ (not illustrated) of the transistor $Tr_{22}$ or a threshold voltage $V_{th2}$ of the transistor $Tr_{22}$, for the gate of the transistor $Tr_{22}$.

The threshold correcting circuit 21 has a transistor $Tr_{23}$ of the second conduction type (third transistor), a transistor $Tr_{24}$ of the second conduction type (fourth transistor), a transistor $Tr_{25}$ of the first conduction type (fifth transistor), and the capacitive element $C_{21}$ (first capacitive element). The transistors $Tr_{23}$ and $Tr_{24}$ are, for example, MOS transistors of the n-channel type, and the transistor $Tr_{25}$ is, for example, a MOS transistor of the p-channel type.

The source or drain of the transistor $Tr_{23}$ is connected to the source or drain of the transistor $Tr_{24}$ and the capacitive element $C_{21}$. A connection point B at which the source or drain of the transistor $Tr_{23}$, the source or drain of the transistor $Tr_{24}$, and the capacitive element $C_{21}$ are connected to one another is connected to the gate of the transistor $Tr_{21}$. The capacitive element $C_{21}$ is inserted between the gate of the transistor $Tr_{21}$ (or the connection point B) and the input terminal of the inverter circuit 20. The source or drain of the transistor $Tr_{23}$, which is not connected to the connection point B, is connected to the low-voltage line $L_L$. The source or drain of the transistor $Tr_{24}$, which is not connected to the connection point B, is connected to the source or drain of the transistor $Tr_{25}$. A connection point D between the source or drain of the transistor $Tr_{24}$, which is not connected to the connection point B, and the source or drain of the transistor $Tr_{25}$ is connected to the source or drain of the transistor $Tr_{21}$, which is not connected to the high-voltage line $L_H$. The source or drain of the transistor $Tr_{25}$, which is not connected to the connection point D, is connected to the source or drain of the transistor $Tr_{28}$ which will be described later and an output terminal of the inverter circuit 20 (the output terminal OUT of the buffer circuit 1). In the threshold correcting circuit 21, any device may be provided between the transistors $Tr_{23}$ and $Tr_{24}$, between the transistors $Tr_{24}$ and $Tr_{25}$, between the transistor $Tr_{24}$ and the capacitive element $C_{21}$, between the transistor $Tr_{25}$ and the output terminal of the inverter circuit 20 (the output terminal OUT of the buffer circuit 1), between the transistor $Tr_{24}$ and the output terminal of the inverter 20 (the output terminal OUT of the buffer circuit 1), between the transistor $Tr_{25}$ and the high-voltage line $L_H$, and between the transistor $Tr_{23}$ and the low-voltage line $L_L$.

The threshold correcting circuit 21 has a transistor $Tr_{26}$ of the first conduction type (sixth transistor), a transistor $Tr_{27}$ of the second conduction type (seventh transistor), the transistor $Tr_{28}$ of the second conduction type (eighth transistor), and the capacitive element $C_{22}$ (second capacitive element). The transistor $Tr_{26}$ is, for example, a MOS transistor of the p-channel type, and the transistors $Tr_{27}$ and $Tr_{28}$ are, for example, MOS transistors of the n-channel type.

The source or drain of the transistor $Tr_{26}$ is connected to the source or drain of the transistor $Tr_{27}$ and the capacitive element $C_{22}$. A connection point C at which the source or drain of the transistor $Tr_{26}$, the source or drain of the transistor $Tr_{27}$, and the capacitive element $C_{22}$ are connected to one another is connected to the gate of the transistor $Tr_{22}$. The capacitive element $C_{22}$ is inserted between the gate of the transistor $Tr_{22}$ (or the connection point C) and the input terminal of the inverter circuit 20. The source or drain of the transistor $Tr_{26}$, which is not connected to the connection point C, is connected to the high-voltage line $L_H$. The source or drain of the transistor $Tr_{27}$, which is not connected to the connection point C, is connected to the source or drain of the transistor $Tr_{28}$. A connection point E between the source or drain of the transistor $Tr_{27}$, which is not connected to the connection point C, and the source or drain of the transistor $Tr_{28}$ is connected to the source or drain of the transistor $Tr_{22}$, which is not connected to the low-voltage line $L_L$. The source or drain of the transistor $Tr_{28}$, which is not connected to the connection point E, is connected to the source or drain of the transistor $Tr_{25}$ and an output terminal of the inverter circuit 20 (the output terminal OUT of the buffer circuit 1). In the threshold correcting circuit 21, any device may be provided between the transistors $Tr_{26}$ and $Tr_{27}$, between the transistors $Tr_{27}$ and $Tr_{28}$, between the transistor $Tr_{27}$ and the capacitive element $C_{22}$, between the transistor $Tr_{28}$ and the output terminal of the inverter circuit 20 (the output terminal OUT of the buffer circuit 1), between the transistor $Tr_{27}$ and the output terminal of the inverter 20 (the output terminal OUT of the buffer circuit 1), between the transistor $Tr_{26}$ and the high-voltage line $L_H$, and between the transistor $Tr_{28}$ and the low-voltage line $L_L$.

Each of the gates of the six transistors (transistors $Tr_{23}$ to $Tr_{28}$) in the threshold correcting circuit 21 is connected to a not-shown control signal line, and control signals AZ1 to AZ6 are input to the gates of the transistors $Tr_{23}$ to $Tr_{28}$, via control signal lines.

Operation

Next, the operation of the buffer circuit 1 in the embodiment will be described. In the following, mainly, threshold correction ($V_{th}$ cancellation) in the buffer circuit 1 will be described.

Figure 2:
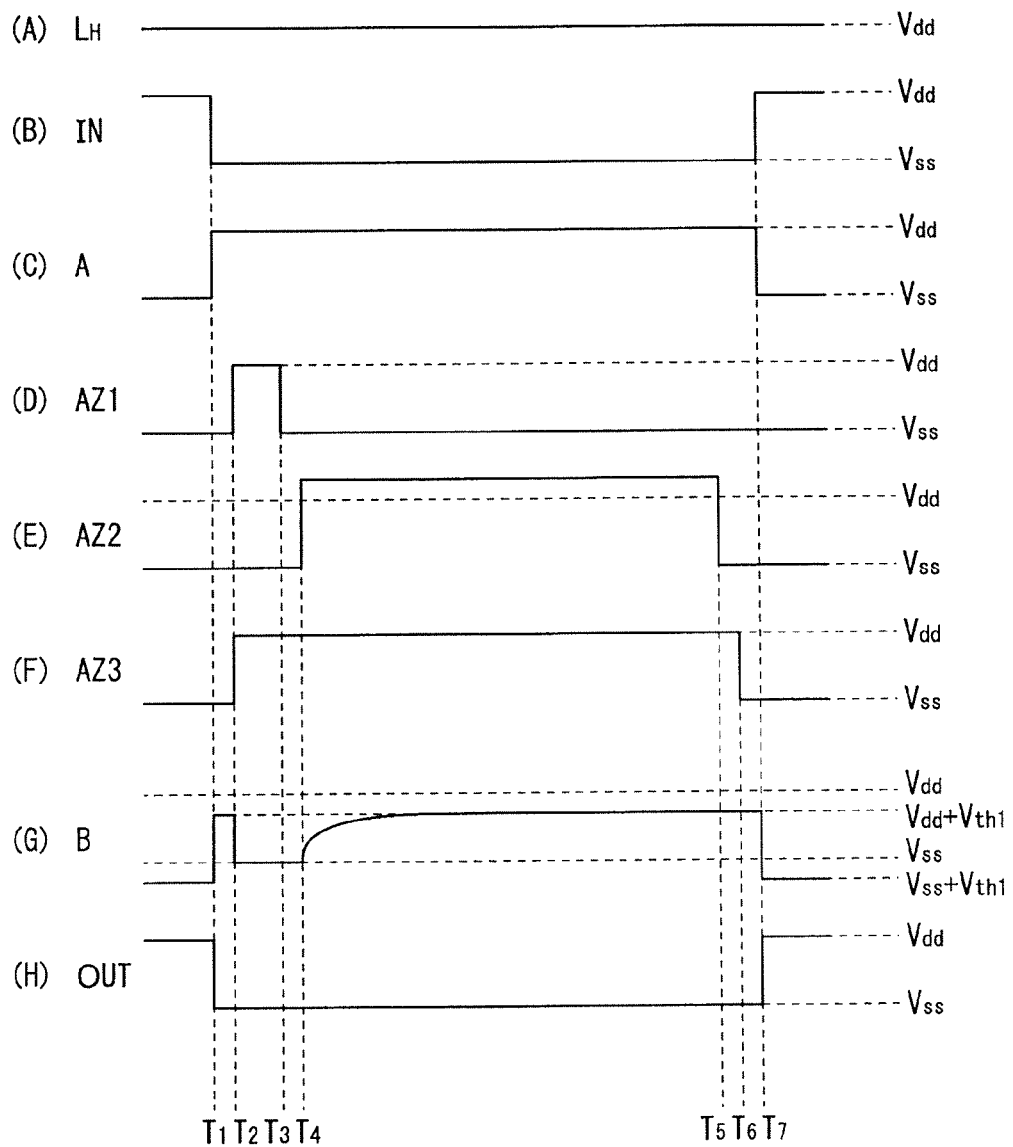
FIG. 2 is a waveform chart illustrating an example of the operation of the buffer circuit in FIG. 1.
Figure 3:
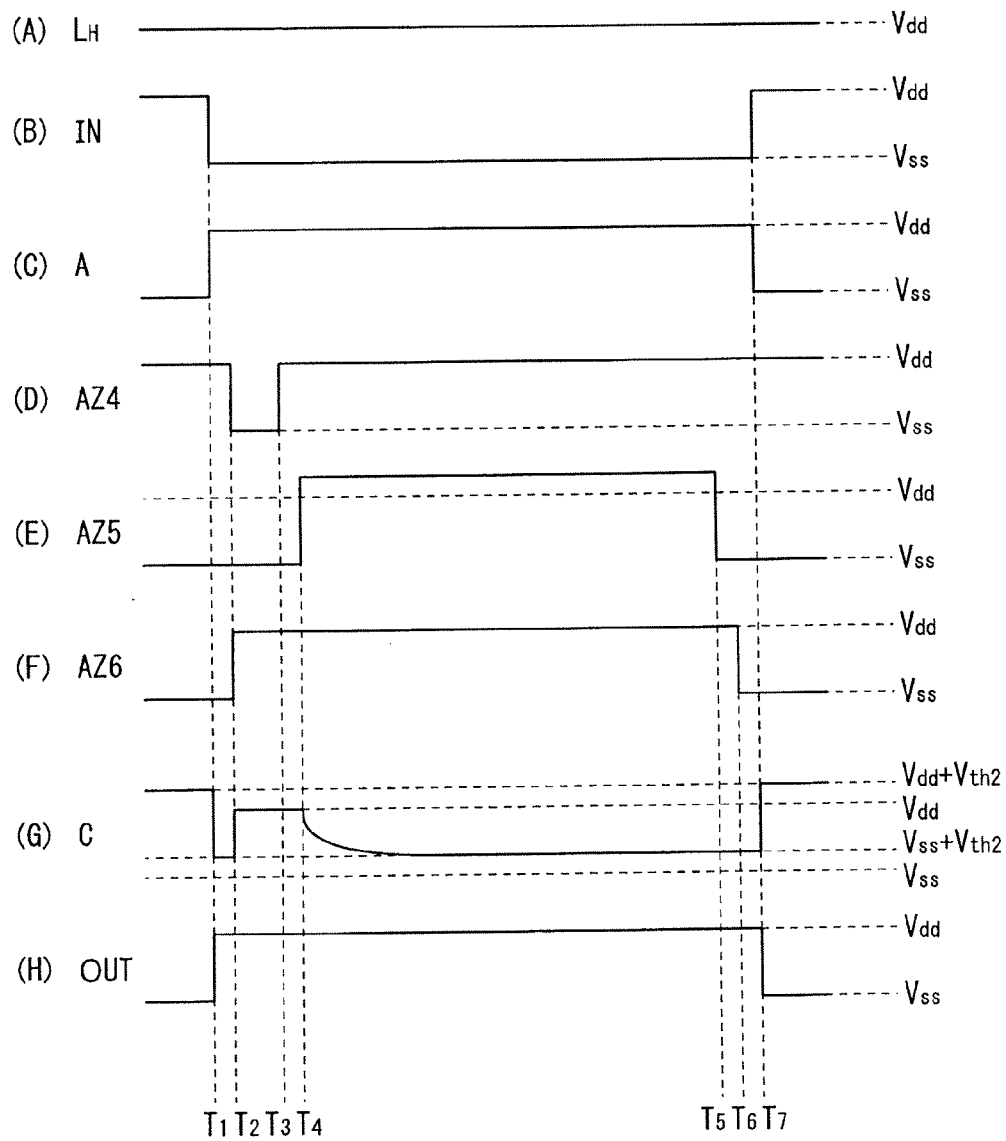
FIG. 3 is a waveform chart expressing another example of the operation of the buffer circuit in FIG. 1.

FIGS. 2 and 3 express an example of the operation of the buffer circuit 1. FIG. 2 illustrates an example of the operation of cancelling the threshold voltage $V_{th1}$ included in the gate-source voltage $V_{gs}$ of the transistor $Tr_{21}$. FIG. 3 illustrates an example of the operation of cancelling the threshold voltage $V_{th2}$ included in the gate-source voltage $V_{gs}$ of the transistor $Tr_{22}$.

First, the operation of cancelling the threshold voltage $V_{th1}$ included in the gate-source voltage $V_{gs}$ of the transistor $Tr_{21}$ will be described. It is assumed that, as shown in (A) in FIG. 2, the voltage of the high-voltage line $L_H$ has a constant value ($V_{dd}$).

To the input terminal IN of the buffer circuit 1, $V_{ss}$ is input ($T_1$). The voltage at the contact point A (the output terminal of the inverter circuit 10) becomes $V_{dd}$, and the transistor $Tr_{21}$ is turned off. All of the control signals AZ1 to AZ3 are $V_{ss}$, the transistors $Tr_{23}$ and $Tr_{24}$ are turned off, and the transistor $Tr_{25}$ is turned on. Next, the control signals AZ1 and AZ3 become $V_{dd}$ ($T_2$), the transistor $Tr_{23}$ is turned on, and the transistor $Tr_{25}$ is turned off. As a result, the voltage at the contact point B becomes $V_{ss}$. Subsequently, the control signal AZ1 becomes $V_{ss}$ ($T_3$), the transistor $Tr_{23}$ is turned off, the control signal AZ2 comes to have a voltage value slightly larger than $V_{dd}$ ($T_4$), and the transistors $Tr_{24}$ and $Tr_{21}$ are turned on. Current flows in the transistors $Tr_{24}$ and $Tr_{21}$, and the voltage at the contact point B gradually rises. When the voltage at the contact point B becomes $V_{dd}+V_{th1}$, the transistor $Tr_{21}$ is turned off. It stops the rise of the voltage at the contact point B at $V_{dd}+V_{th1}$, and the voltage at the contact point B is held at $V_{dd}+V_{th1}$. That is, by performing the series of operations, for the gate of the transistor $Tr_{21}$, the threshold voltage $V_{th1}$ of the transistor $Tr_{21}$ or a voltage corresponding to the threshold voltage $V_{th1}$ of the transistor $Tr_{21}$ is set as an offset voltage. As a result, even in the case where the threshold voltage $V_{th1}$ of the transistor $Tr_{21}$ varies, the output pulse of $V_{ss}$ is accurately output without no variations in width from the output terminal OUT of the buffer circuit 1 in accordance with the input pulse of $V_{ss}$ to the input terminal IN of the buffer circuit 1. Therefore, variations are allowed to be reduced at both of the trailing timing from $V_{dd}$ to $V_{ss}$ of the output voltage of the buffer circuit 1 and the rising timing from $V_{ss}$ to $V_{dd}$.

Next, the operation of cancelling the threshold voltage $V_{th2}$ included in the gate-source voltage $V_{gs}$ of the transistor $Tr_{22}$ will be described. It is assumed that the voltage of the high-voltage line $L_H$ has a constant value ($V_{dd}$) during the operation as illustrated in (A) in FIG. 3.

To the input terminal IN of the buffer circuit 1, $V_{dd}$ is input ($T_1$). The voltage at the contact point A (the output terminal of the inverter circuit 10) becomes $V_{ss}$, and the transistor $Tr_{22}$ is turned off. At the time, the control signal AZ4 is $V_{dd}$, and both of the control signals AZ5 and AZ6 are $V_{ss}$. Therefore, the transistors $Tr_{26}$, $Tr_{27}$, and $Tr_{28}$ are turned off. Next, the control signal AZ4 become $V_{ss}$, further, the control signal AZ6 becomes $V_{dd}$ ($T_2$), and the transistors $Tr_{26}$ and $Tr_{28}$ are turned on. As a result, the voltage at the contact point C becomes $V_{dd}$. Subsequently, the control signal AZ4 becomes $V_{dd}$ ($T_3$), the transistor $Tr_{26}$ is turned off, the control signal AZ5 comes to have a voltage value slightly larger than $V_{dd}$ ($T_4$), and the transistors $Tr_{27}$ and $Tr_{22}$ are turned on. Current flows in the transistors $Tr_{27}$ and $Tr_{22}$, and the voltage at the contact point C gradually decreases. When the voltage at the contact point C becomes $V_{ss}+V_{th2}$, the transistor $Tr_{22}$ is turned off. It stops the decrease of the voltage at the contact point C at $V_{ss}+V_{th2}$, and the voltage at the contact point C is held at $V_{ss}+V_{th2}$. That is, by performing the series of operations, for the gate of the transistor $Tr_{22}$, the threshold voltage $V_{th2}$ of the transistor $Tr_{22}$ or a voltage corresponding to the threshold voltage $V_{th2}$ of the transistor $Tr_{22}$ is set as an offset voltage. As a result, even in the case where the threshold voltage $V_{th2}$ of the transistor $Tr_{22}$ varies, the output pulse of $V_{dd}$ is accurately output without any variations in width from the output terminal OUT of the buffer circuit 1 in accordance with the input pulse of $V_{dd}$ to the input terminal IN of the buffer circuit 1. Therefore, variations is allowed to be reduced at both of the rising timing from $V_{ss}$ to $V_{dd}$ of the output voltage of the buffer circuit 1 and the trailing timing from $V_{dd}$ to $V_{ss}$.

As described above, in the buffer circuit 1 of the embodiment, the threshold voltage $V_{th1}$ of the transistor $Tr_{21}$ or a voltage corresponding to the threshold voltage $V_{th1}$ of the transistor $Tr_{21}$ is set as an offset voltage for the gate of the transistor $Tr_{21}$. Further, the threshold voltage $V_{th2}$ of the transistor $Tr_{22}$ or a voltage corresponding to the threshold voltage $V_{th2}$ of the transistor $Tr_{22}$ is set as an offset voltage for the gate of the transistor $Tr_{22}$. In such a manner, variations are reduced at both of the trailing timing of the output voltage of the buffer circuit 1 and the rising timing of the output voltage of the buffer circuit 1.

In the case of applying the buffer circuit 1 of the embodiment to, for example, an output stage of a scanner of an organic EL display device, the mobility correction period may be specified by pulse width of the output voltage of the buffer circuit 1. Since variations in the mobility correction period are reduced in such a manner, variations in current flowing in the organic EL element at the time of light emission are reduced, and uniformity of luminance is improved.

Modification of First Embodiment

Figure 4:
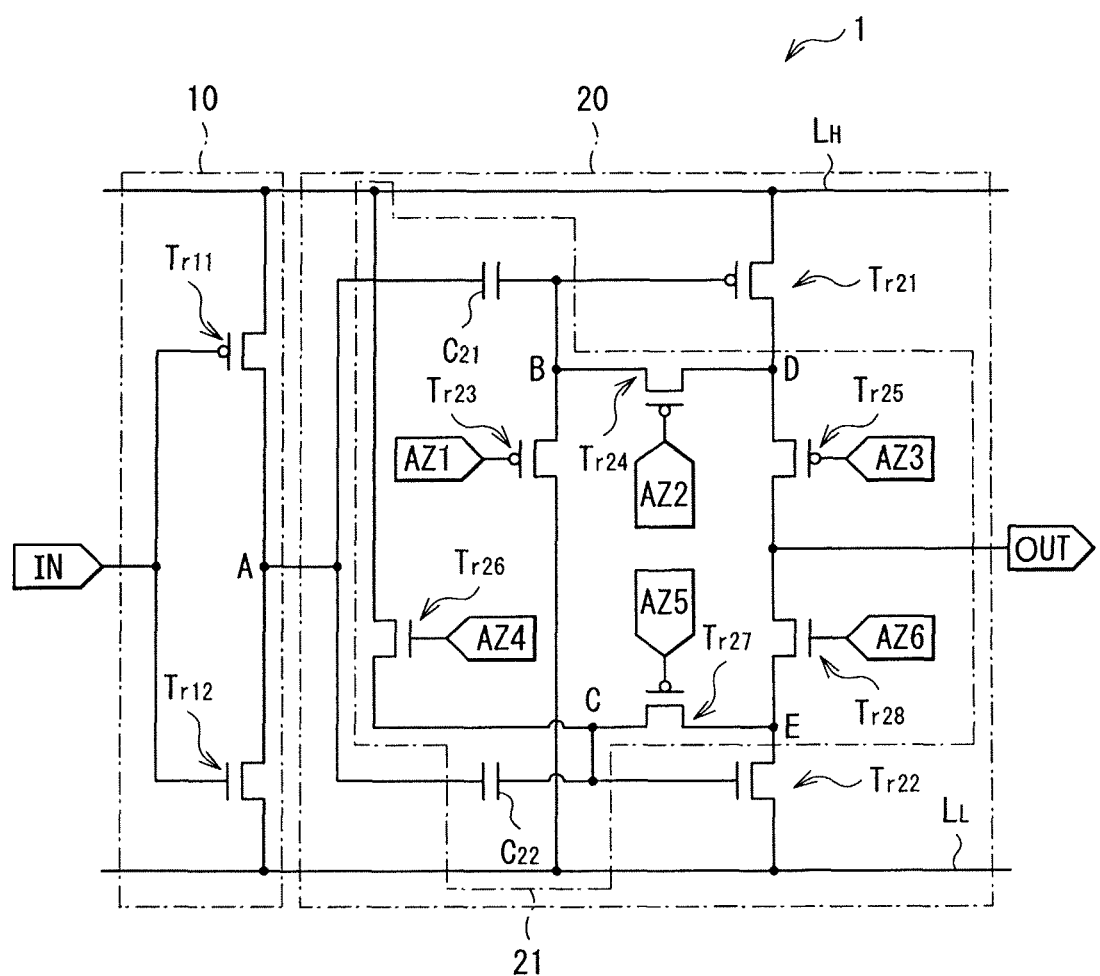
FIG. 4 is a circuit diagram illustrating another example of the buffer circuit in FIG. 1.
Figure 5:
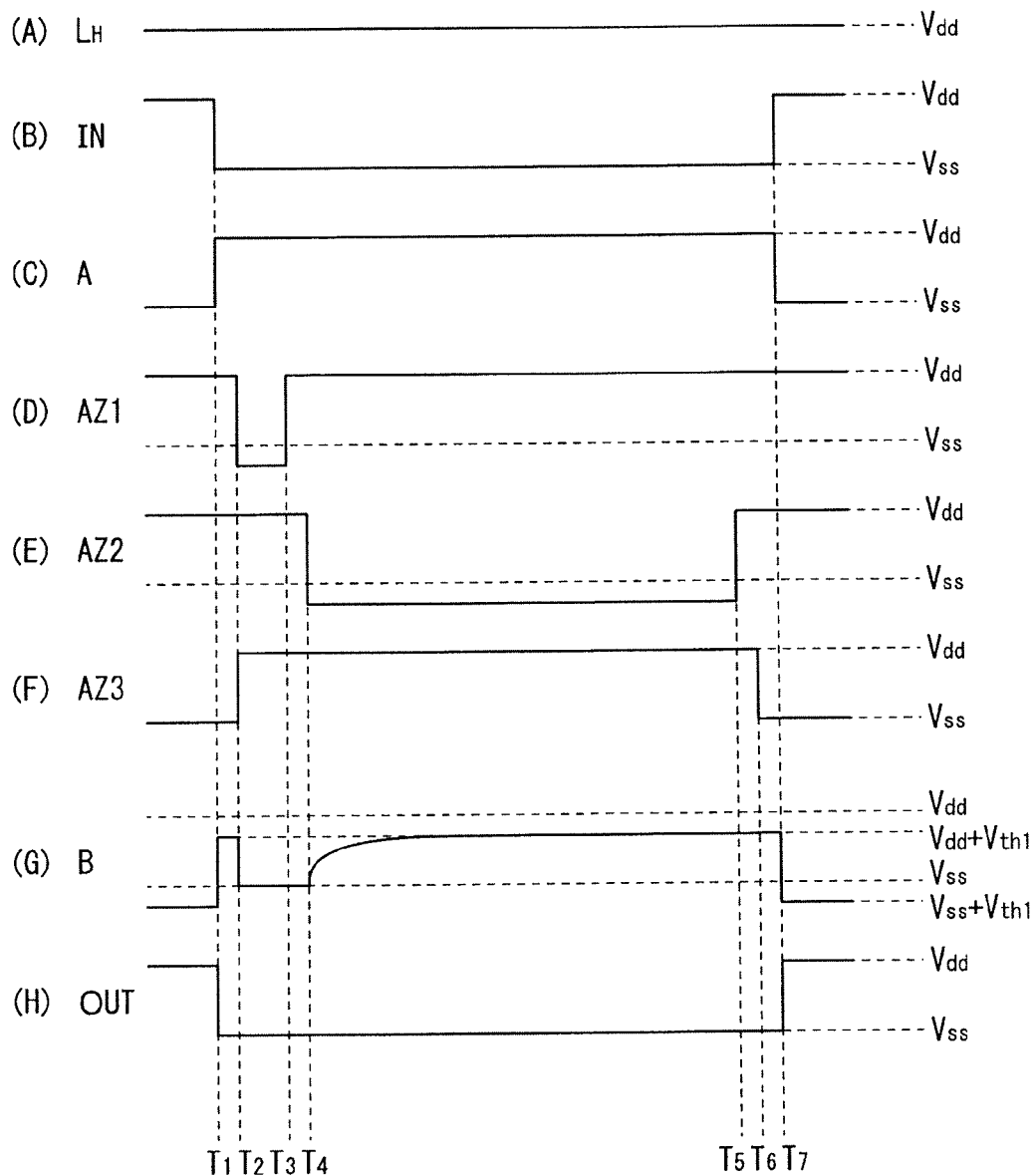
FIG. 5 is a waveform chart illustrating an example of the operation of the buffer circuit in FIG. 4.
Figure 6:
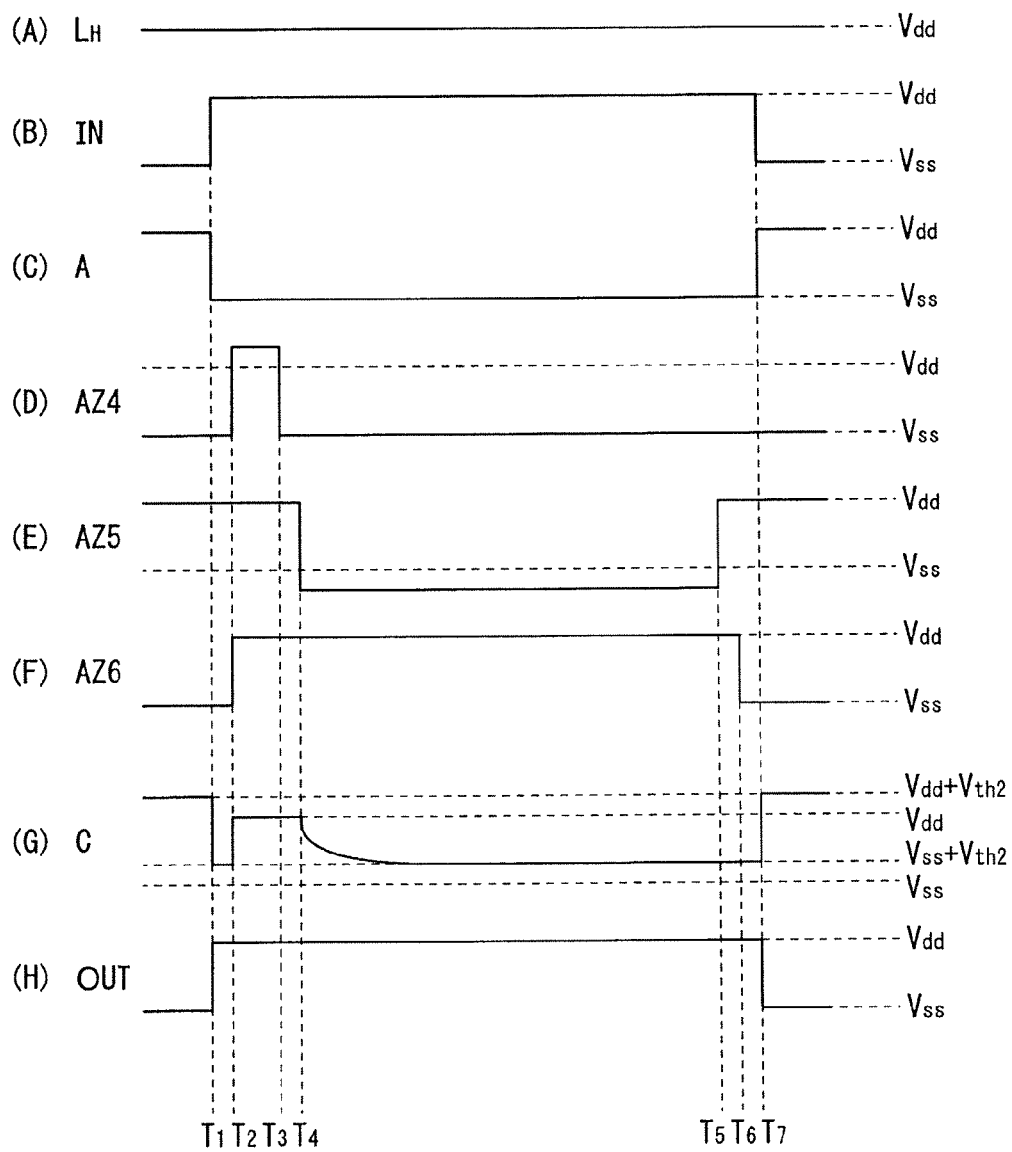
FIG. 6 is a waveform chart illustrating another example of the operation of the buffer circuit in FIG. 4.

Although the transistors $Tr_{23}$, $Tr_{24}$, and $Tr_{27}$ are MOS transistors of the n-channel type and the transistor $Tr_{26}$ is an MOS transistor of the p-channel type in the foregoing embodiment, the conduction types of the transistors may be opposite. Concretely, as illustrated in FIG. 4, the transistors $Tr_{23}$, $Tr_{24}$, and $Tr_{27}$ may be MOS transistors of the p-channel type, and the transistor $Tr_{26}$ may be the MOS transistor of the n-channel type. In this case, for example, as illustrated in FIGS. 5 and 6, the signal waveforms of the control signals AZ1, AZ2, AZ4, and AZ5 are obtained by inverting the signal waveforms of the control signals AZ1, AZ2, AZ4, and AZ5 illustrated in FIGS. 2 and 3.

Second Embodiment

Figure 7:
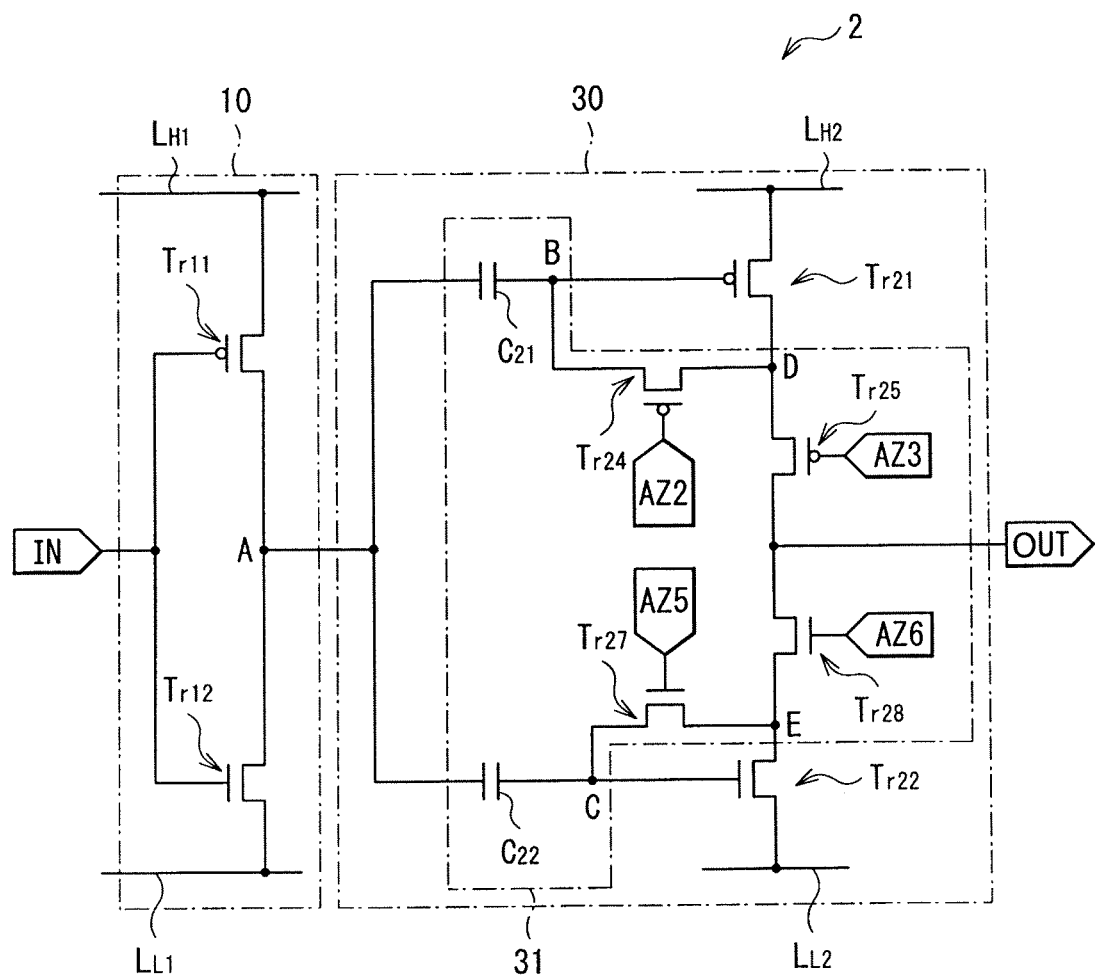
FIG. 7 is a circuit diagram expressing an example of a buffer circuit according to a second embodiment of the invention.

Next, a buffer circuit 2 (drive circuit) according to a second embodiment of the invention will be described. FIG. 7 expresses an example of the general configuration of the buffer circuit 2. Like the buffer circuit 1, the buffer circuit 2 outputs a pulse signal having a phase which is almost the same as that of a pulse signal input to an input terminal IN, from an output terminal OUT. The buffer circuit 2 has the inverter circuit 10 (input-side inverter circuit) and an inverter circuit 30 (output-side inverter circuit).

The inverter circuit 30 outputs a pulse signal obtained by almost inverting the waveform of an input pulse signal. The inverter circuits 10 and 30 are connected in series and inserted between the high-voltage line $L_H$ and the low-voltage line $L_L$. The inverter circuit 30 is disposed on the output terminal OUT side in relation with the inverter circuit 10, and the output terminal of the inverter circuit 30 corresponds to the output terminal OUT of the buffer circuit 2. The output terminal (a part corresponding to A in the diagram) of the inverter circuit 10 is connected to the input terminal of the inverter circuit 30, and the buffer circuit 2 is constructed so that an output of the inverter circuit 10 is input to the inverter circuit 30.

The inverter circuit 30 has a circuit configuration in which a threshold correcting circuit 31 is provided in place of the threshold correcting circuit 21 in the inverter circuit 20 of the foregoing embodiment. The threshold correcting circuit 31 has a circuit configuration obtained by eliminating the transistors $Tr_{23}$ and $Tr_{26}$ from the threshold correcting circuit 21 of the foregoing embodiment. In the threshold correcting circuit 31, the transistor $Tr_{24}$ is a MOS transistor of the second conduction type, for example, a MOS transistor of the p-channel type.

The inverter circuit 30 has high-voltage lines $L_{H1}$ and $L_{H2}$ independent of each other in place of the high-voltage line $L_H$, and has low-voltage lines $L_{L1}$ and $L_{L2}$ independent of each other in place of the low-voltage line $L_L$. The high-voltage line $L_{H1}$ is for the inverter circuit 10 and is connected to the source or drain of the transistor $Tr_{11}$, which is not connected to the connection point A. The low-voltage line $L_{L1}$ is for the inverter circuit 10 and is connected to the source or drain of the transistor $Tr_{12}$, which is not connected to the connection point A. The high-voltage line $L_{H2}$ is for the inverter circuit 30 and is connected to the source or drain of the transistor $Tr_{21}$, which is not connected to the connection point D. The low-voltage line $L_{L2}$ is for the inverter circuit 30 and is connected to the source or drain of the transistor $Tr_{22}$, which is not connected to the connection point E.

Operation

Next, the operation of the buffer circuit 2 in the embodiment will be described. In the following, mainly, threshold correction ($V_{th}$ cancellation) in the buffer circuit 2 will be described.

Figure 8:
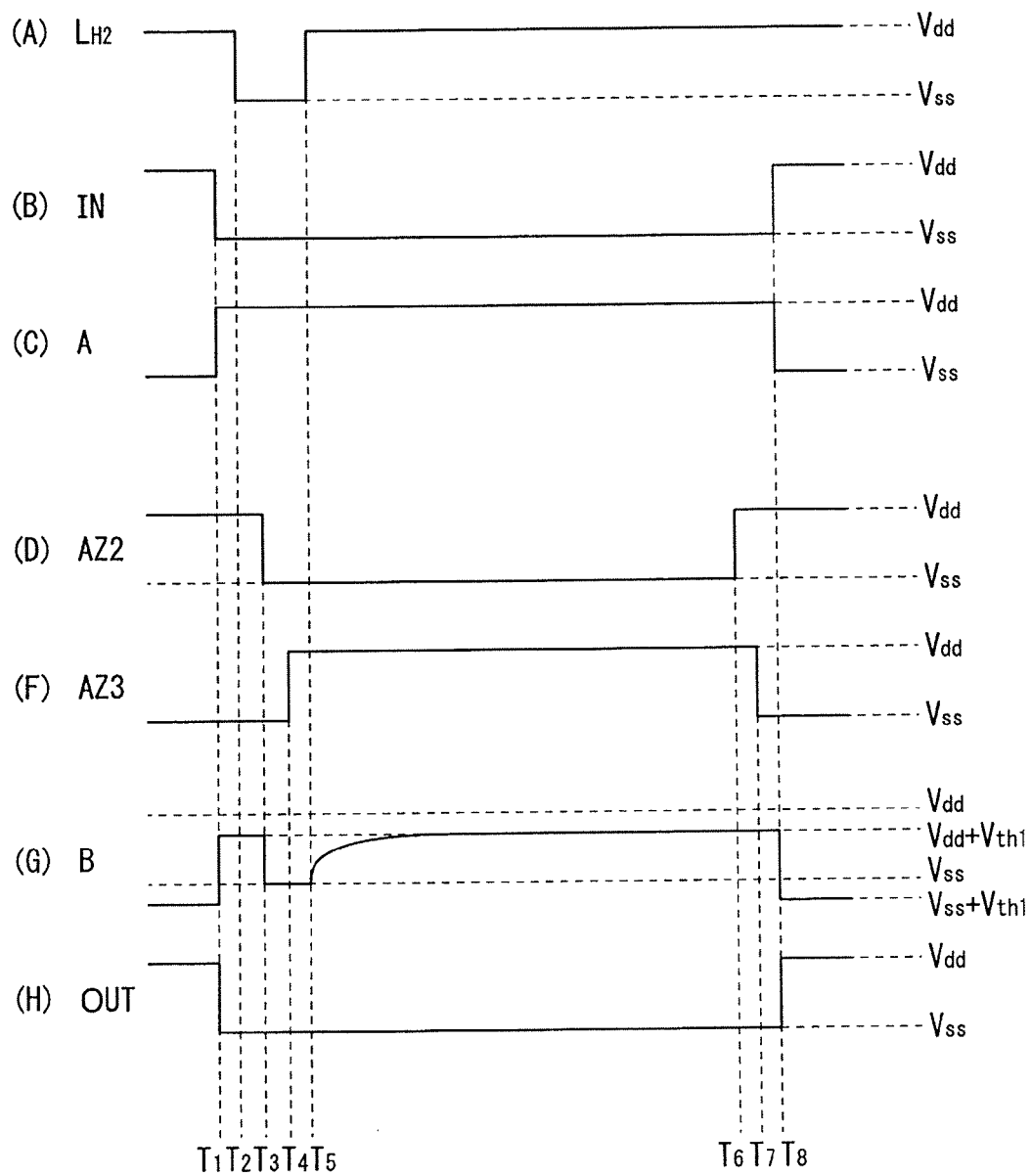
FIG. 8 is a waveform chart illustrating an example of the operation of the buffer circuit in FIG. 7.
Figure 9:
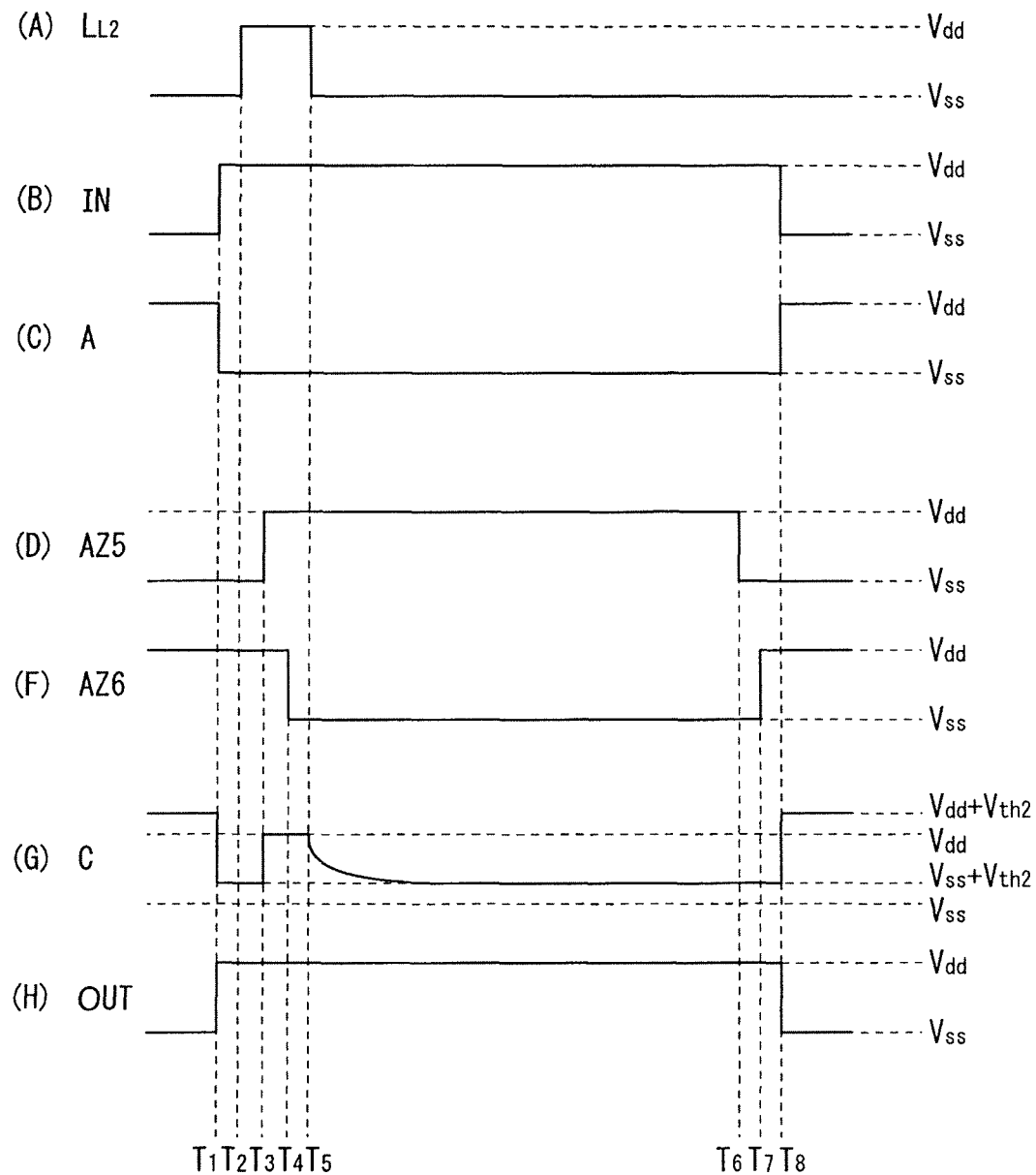
FIG. 9 is a waveform chart expressing another example of the operation of the buffer circuit in FIG. 7.

FIGS. 8 and 9 express an example of the operation of the buffer circuit 2. FIG. 8 illustrates an example of the operation of cancelling the threshold voltage $V_{th1}$ included in the gate-source voltage $V_{gs}$ of the transistor $Tr_{21}$. FIG. 9 illustrates an example of the operation of cancelling the threshold voltage $V_{th2}$ included in the gate-source voltage $V_{gs}$ of the transistor $Tr_{22}$.

First, the operation of cancelling the threshold voltage $V_{th1}$ included in the gate-source voltage $V_{gs}$ of the transistor $Tr_{21}$ will be described. The embodiment is largely different from the first embodiment with respect to the point that, as shown in (A) in FIG. 8, a pulse signal which trails from $V_{dd}$ to $V_{ss}$ at a predetermined timing is applied to the high-voltage line $L_{H2}$.

To the input terminal IN of the buffer circuit 2, $V_{ss}$ is input ($T_1$). The voltage at the contact point A (the output terminal of the inverter circuit 10) becomes $V_{dd}$, and the transistor $Tr_{21}$ is turned off. At this time, the control signal AZ2 is equal to $V_{dd}$, and the control signal AZ3 is equal to $V_{ss}$. Accordingly, the transistor $Tr_{24}$ is turned off, and the transistor $Tr_{25}$ is turned on. Next, the voltage of the high-voltage line $L_{H2}$ trails from $V_{dd}$ to $V_{ss}$ ($T_2$), after that, the control signal AZ2 becomes $V_{ss}$ ($T_3$), and the transistor $Tr_{24}$ is turned on. As a result, the voltage at the contact point B becomes $V_{ss}$. Subsequently, the control signal AZ3 becomes $V_{dd}$ ($T_4$), the transistor $Tr_{25}$ is turned off and, after that, the voltage of the high-voltage line $L_{H2}$ rises from $V_{ss}$ to $V_{dd}$ ($T_5$). As a result, current flows in the transistors $Tr_{24}$ and $Tr_{21}$. When the voltage at the contact point B gradually rises and becomes $V_{dd}+V_{th1}$, the transistor $Tr_{21}$ is turned off. It stops the rise of the voltage at the contact point B at $V_{dd}+V_{th1}$, and the voltage at the contact point B is held at $V_{dd}+V_{th1}$. That is, by performing the series of operations, for the gate of the transistor $Tr_{21}$, the threshold voltage $V_{th1}$ of the transistor $Tr_{21}$ or a voltage corresponding to the threshold voltage $V_{th1}$ of the transistor $Tr_{21}$ is set as an offset voltage. As a result, even in the case where the threshold voltage $V_{th1}$ of the transistor $Tr_{21}$ varies, the output pulse of $V_{ss}$ is accurately output without any variations in width from the output terminal OUT of the buffer circuit 2 in accordance with the input pulse of $V_{ss}$ to the input terminal IN of the buffer circuit 2. Therefore, variations are allowed to be reduced at both of the trailing timing from $V_{dd}$ to $V_{ss}$ of the output voltage of the buffer circuit 2 and the rising timing from $V_{ss}$ to $V_{dd}$.

Next, the operation of cancelling the threshold voltage $V_{th2}$ included in the gate-source voltage $V_{gs}$ of the transistor $Tr_{22}$ will be described. The embodiment is largely different from the first embodiment with respect to the point that the pulse signal which rises from $V_{ss}$ to $V_{dd}$ at a predetermined timing is applied to the low-voltage line $L_{L2}$ as illustrated in (A) in FIG. 9.

To the input terminal IN of the buffer circuit 2, $V_{dd}$ is input ($T_1$). The voltage at the contact point A (the output terminal of the inverter circuit 10) becomes $V_{ss}$, and the transistor $Tr_{22}$ is turned off. At this time, the control signal AZ5 is $V_{ss}$, and the control signal AZ6 is $V_{dd}$. Therefore, the transistor $Tr_{27}$ is turned off, and $Tr_{28}$ are turned on. Next, the voltage of the low-voltage line $L_{L2}$ rises from $V_{ss}$ to $V_{dd}$ ($T_2$), after that, the control signal AZ5 become $V_{dd}$ ($T_3$), and the transistor $Tr_{27}$ is turned on. As a result, the voltage at the contact point C becomes $V_{dd}$. Subsequently, the control signal AZ6 becomes $V_{ss}$ ($T_4$), the transistor $Tr_{28}$ is turned off and, after that, the voltage of the low-voltage line $L_{L2}$ trails from $V_{dd}$ to $V_{ss}$ ($T_5$). Current flows in the transistors $Tr_{27}$ and $Tr_{22}$, and the voltage at the contact point C gradually decreases. When the voltage at the contact point C becomes $V_{ss}+V_{th2}$, the transistor $Tr_{22}$ is turned off. It stops the decrease of the voltage at the contact point C at $V_{ss}+V_{th2}$, and the voltage at the contact point C is held at $V_{ss}+V_{th2}$. That is, by performing the series of operations, for the gate of the transistor $Tr_{22}$, the threshold voltage $V_{th2}$ of the transistor $Tr_{22}$ or a voltage corresponding to the threshold voltage $V_{th2}$ of the transistor $Tr_{22}$ is set as an offset voltage. As a result, even in the case where the threshold voltage $V_{th2}$ of the transistor $Tr_{22}$ varies, the output pulse of $V_{dd}$ is accurately output without any variations in width from the output terminal OUT of the buffer circuit 2 in accordance with the input pulse of $V_{dd}$ to the input terminal IN of the buffer circuit 2. Therefore, variations are reduced at both of the rising timing from $V_{ss}$ to $V_{dd}$ of the output voltage of the buffer circuit 2 and the trailing timing from $V_{dd}$ to $V_{ss}$.

As described above, in the buffer circuit 2 of the embodiment, the threshold voltage $V_{th1}$ of the transistor $Tr_{21}$ or a voltage corresponding to the threshold voltage $V_{th1}$ of the transistor $Tr_{21}$ is set as an offset voltage for the gate of the transistor $Tr_{21}$. Further, the threshold voltage $V_{th2}$ of the transistor $Tr_{22}$ or a voltage corresponding to the threshold voltage $V_{th2}$ of the transistor $Tr_{22}$ is set as an offset voltage for the gate of the transistor $Tr_{22}$. In such a manner, variations are reduced at both of the trailing timing of the output voltage of the buffer circuit 2 and the rising timing of the output voltage of the buffer circuit 2.

In the case of applying the buffer circuit 2 of the embodiment to, for example, an output stage of a scanner of an organic EL display device, the mobility correction period may be specified by pulse width of the output voltage of the buffer circuit 2. Since variations in the mobility correction period are reduced in such a manner, variations in current flowing in the organic EL element at the time of light emission are reduced, and uniformity of luminance is improved.

Modification of Second Embodiment

Figure 10:
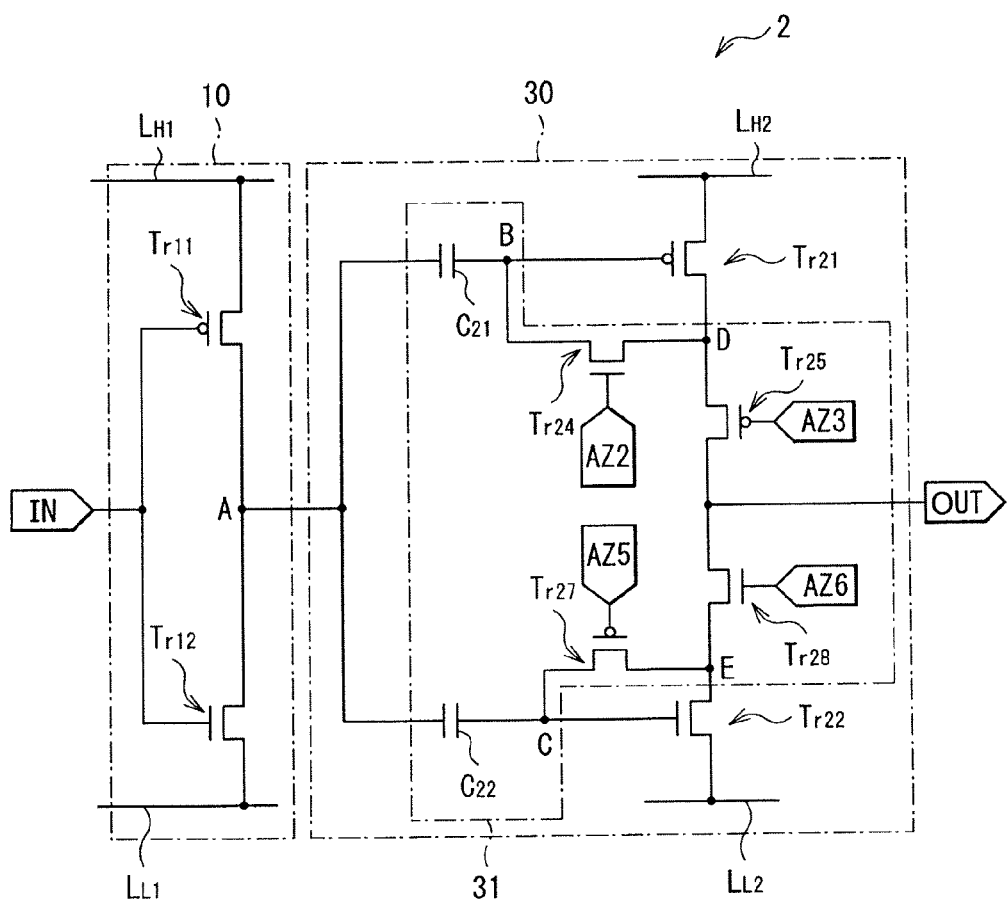
FIG. 10 is a circuit diagram illustrating another example of the buffer circuit in FIG. 7.
Figure 11:
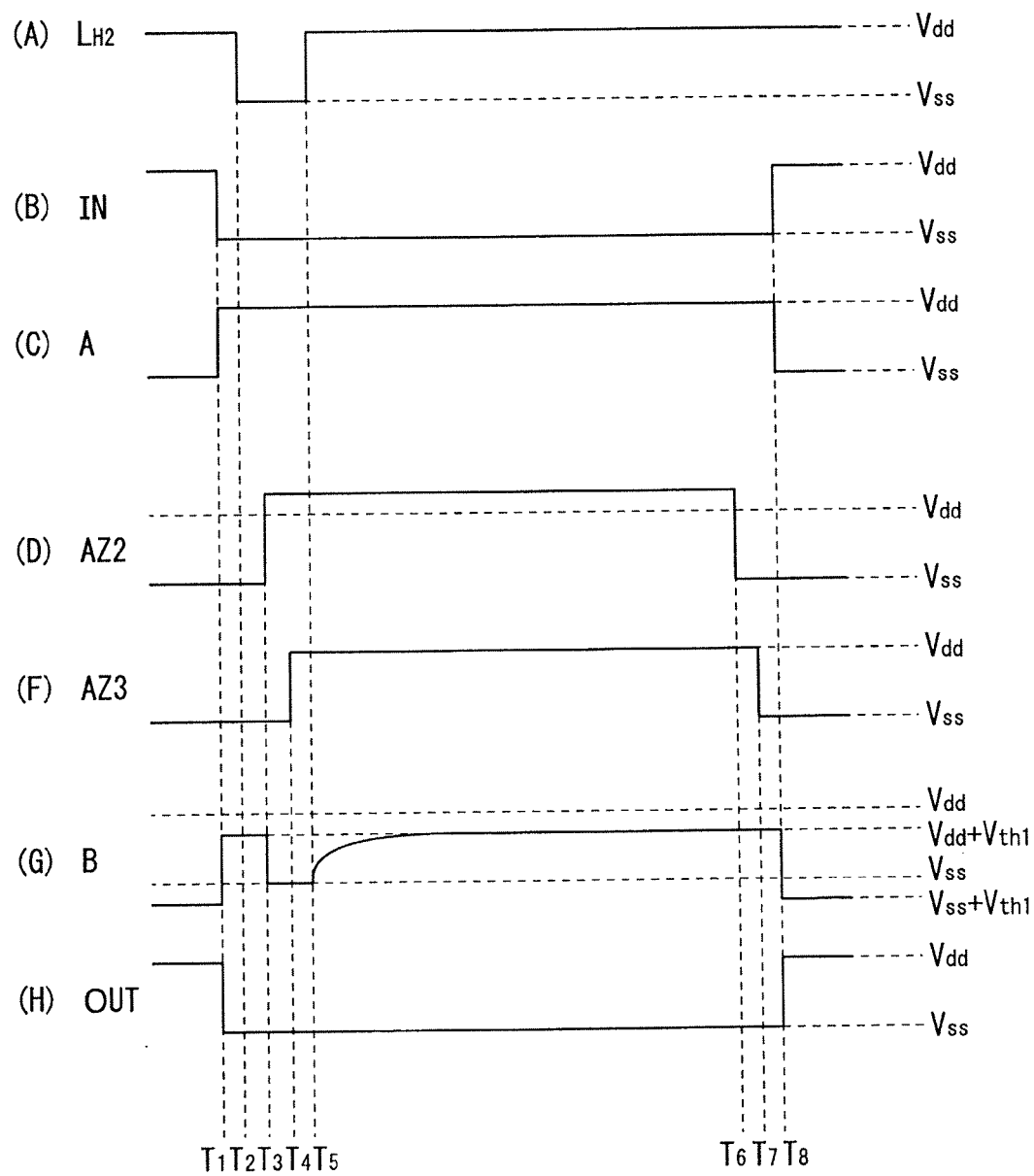
FIG. 11 is a waveform chart illustrating an example of the operation of the buffer circuit in FIG. 10.
Figure 12:
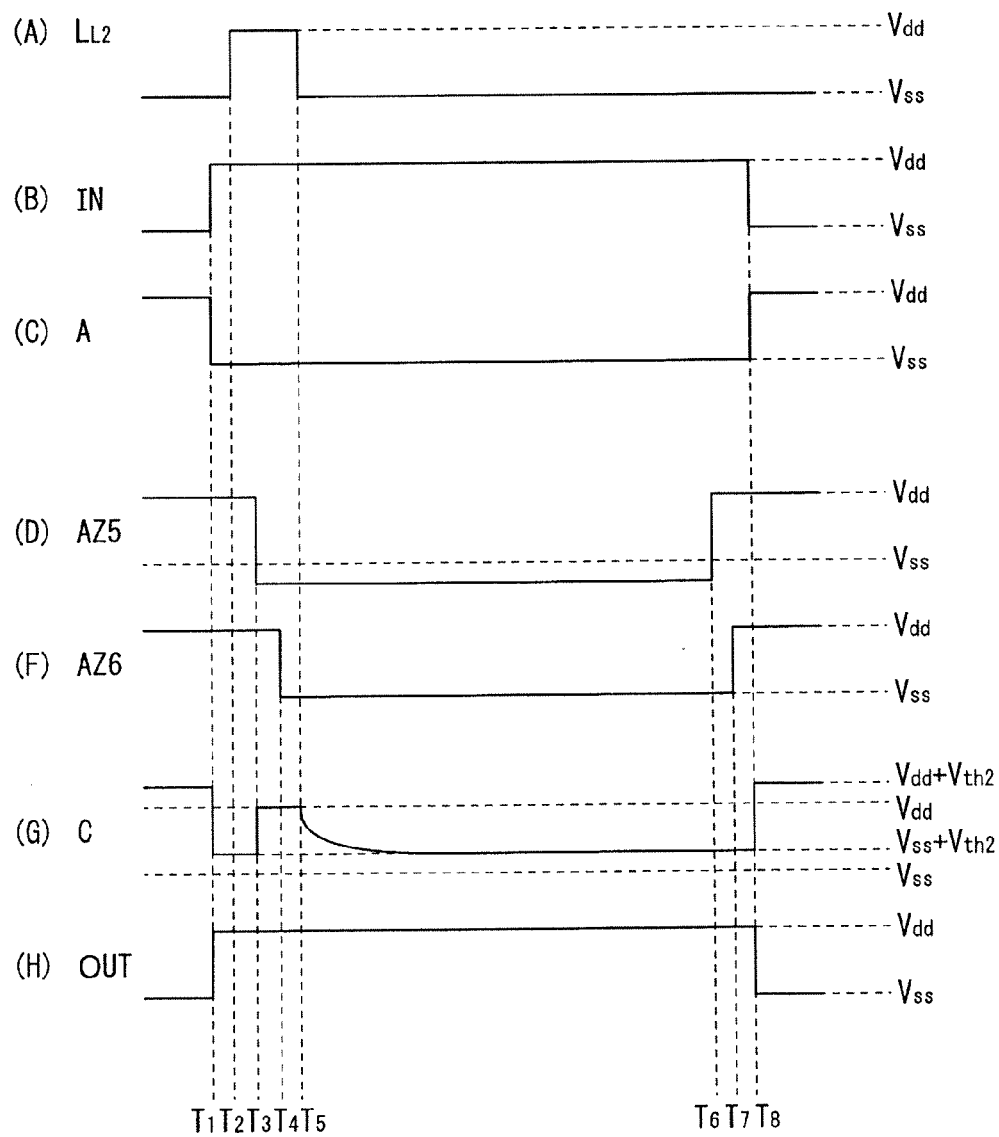
FIG. 12 is a waveform chart illustrating another example of the operation of the buffer circuit in FIG. 10.

Although the transistor $Tr_{24}$ is a MOS transistor of the p-channel type and the transistor $Tr_{27}$ is a MOS transistor of the n-channel type in the second embodiment, the conduction types of the transistors may be opposite. Concretely, as illustrated in FIG. 10, the transistor $Tr_{24}$ may be a MOS transistor of the n-channel type, and the transistor $Tr_{27}$ may be a MOS transistor of the p-channel type. In this case, for example, as illustrated in FIGS. 11 and 12, the signal waveforms of the control signals AZ2 and AZ5 are obtained by inverting the signal waveforms of the control signals AZ2 and AZ5 illustrated in FIGS. 8 and 9.

Application Example

Figure 13:
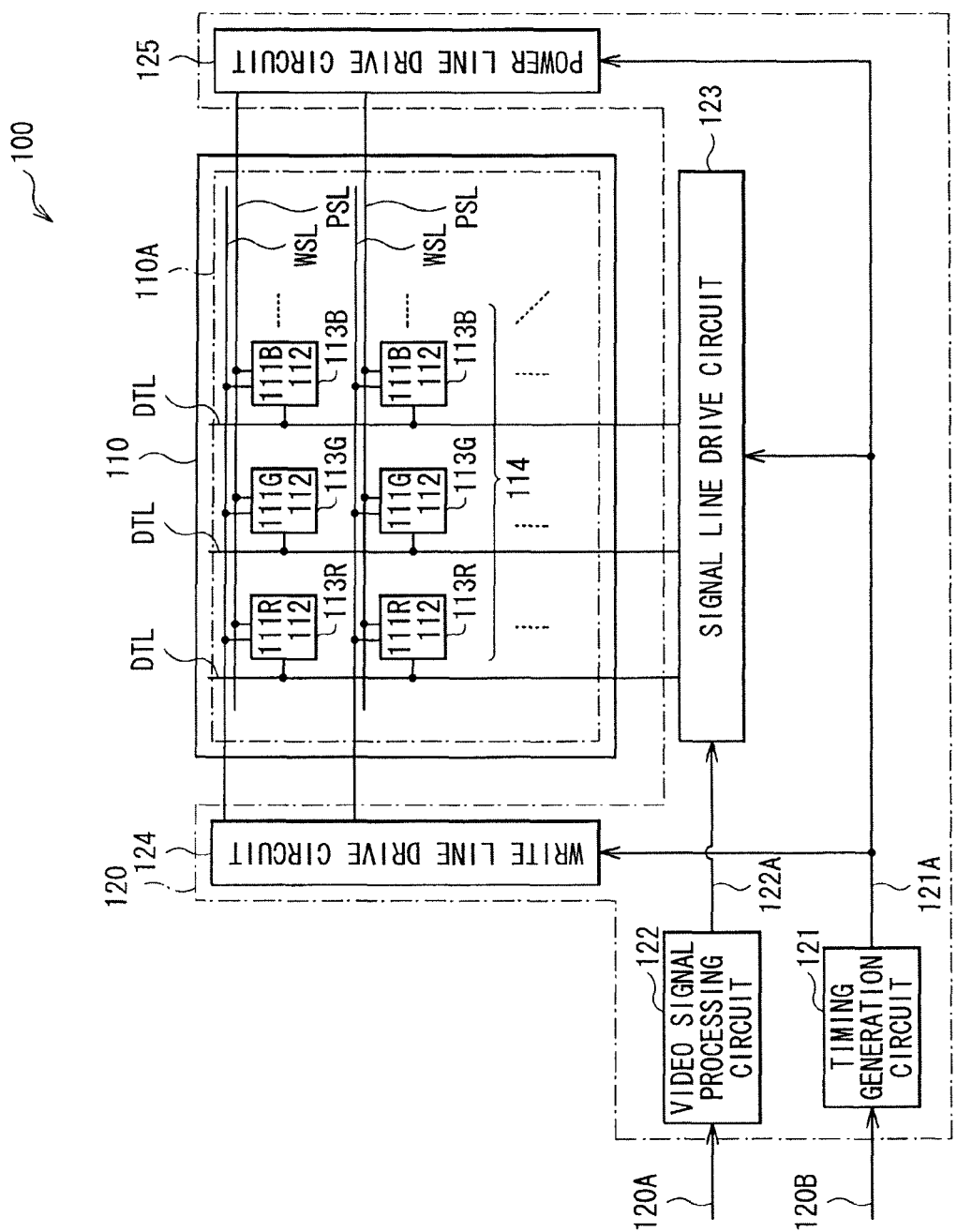
FIG. 13 is a schematic configuration diagram of a display device as an example of application of the buffer circuit of any of the embodiments.

FIG. 13 expresses an example of a generation configuration of a display device 100 as an example of application of the buffer circuits 1 and 2 according to the embodiments. The display device 100 has, for example, a display panel 110 (display section) and a drive circuit 120 (drive section).

Display Panel 110

The display panel 110 has a display region 110A in which three kinds of organic EL elements 111R, 111G, and 111B of different light emission colors are two-dimensionally disposed. The display region 110A is a region for displaying a video image by using light emitted from the organic EL elements 111R, 111G, and 111B. The organic EL element 111R is an organic EL element which emits red light, the organic EL element 111G is an organic EL element which emits green light, and the organic EL element 111B is an organic EL element which emits blue light. In the following, as a collective term of the organic EL elements 111R, 111G, and 111B, an organic EL element 111 will be properly used.

Display Region 110A

Figure 14:
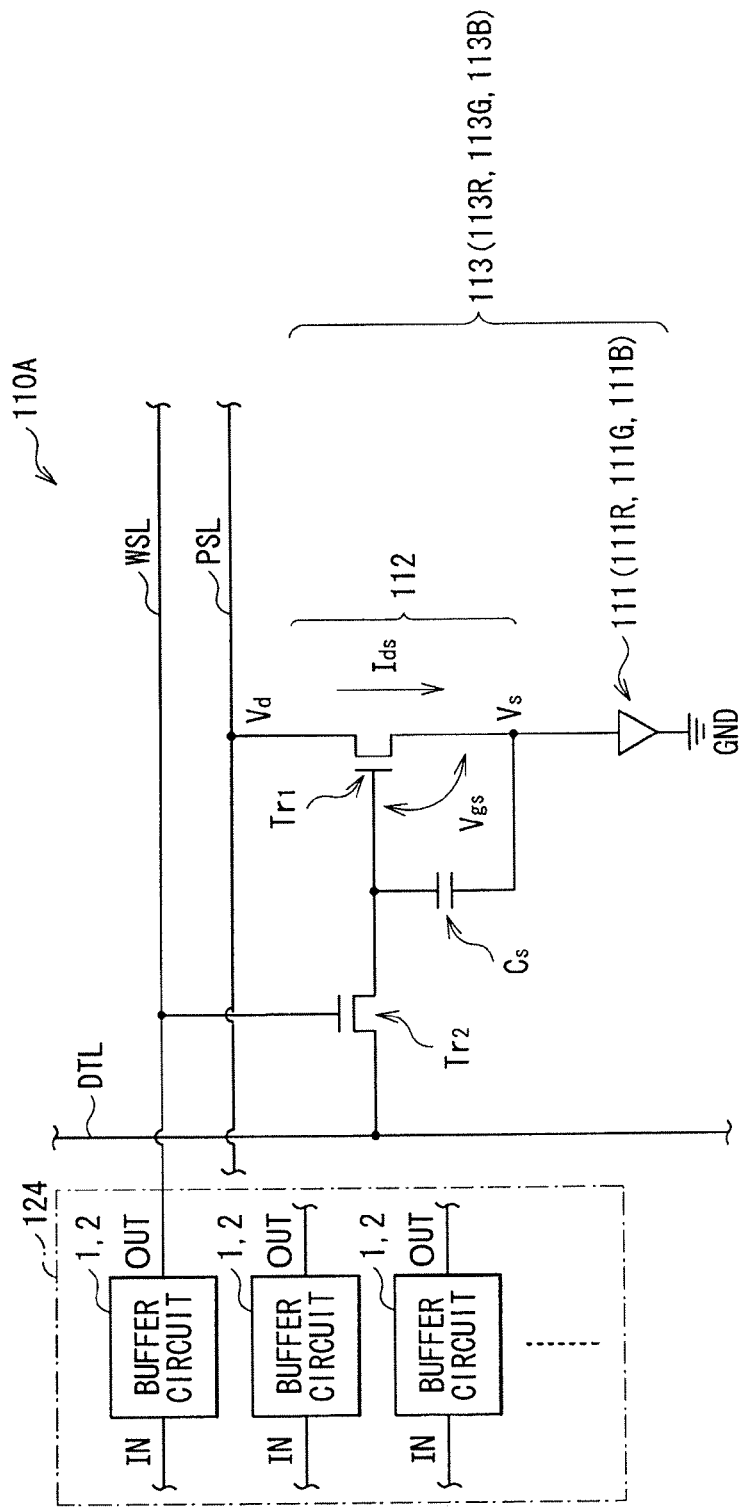
FIG. 14 is a circuit diagram expressing an example of a write line drive circuit and a pixel circuit of FIG. 13.

FIG. 14 illustrates an example of a circuit configuration in the display region 110A together with an example of a write line drive circuit 124 which will be described later. In the display region 110A, a plurality of pixel circuits 112 are two-dimensionally disposed in pairs with the organic EL elements 111. In the application example, a pair of an organic EL element 111 and a pixel circuit 112 forms a pixel 113. More specifically, as shown in FIG. 13, a pair of the organic EL element 111R and the pixel circuit 112 forms one pixel 113R for red, a pair of the organic EL element 111G and the pixel circuit 112 forms one pixel 113G for green, and a pair of the organic EL element 111B and the pixel circuit 112 forms one pixel 113B for blue. Further, three pixels 113R, 113G, and 113B neighboring each other form one display pixel 114.

Each of the pixel circuits 112 includes, for example, the drive transistor $Tr_1$ for controlling current flowing in the organic EL element 111, the write transistor $Tr_2$ for applying voltage of the signal line DTL to the drive transistor $Tr_1$, and the retention capacitor $C_s$, and has the circuit configuration of 2Tr1C. The drive transistor $Tr_1$ and the write transistor $Tr_2$ are, for example, thin film transistors (TFTs) of the n-channel MOS type. The drive transistor $Tr_1$ or the write transistor $Tr_2$ may be, for example, a TFT of the p-channel MOS type.

In the display region 110A, the plurality of write lines WSL (scan lines) are disposed in rows, and the plurality of signal lines DTL are disposed in columns. In the display region 110A, further, a plurality of power lines PSL (members to which source voltage is supplied) are disposed in columns along the write lines WSL. One organic EL element 111 is provided near an intersecting point of a signal line DTL and a write line WSL. Each of the signal lines DTL is connected to the output terminal (not shown) of a signal line drive circuit 123 which will be described later and either a drain electrode or a source electrode of the write transistor $Tr_2$. Each of the write lines WSL is connected to the output terminal (not shown) of the write line drive circuit 124 which will be described later and the gate electrode (not shown) of the write transistor $Tr_2$. Each of the power lines PSL is connected to the output terminal (not shown) of a power line drive circuit 125 which will be described later and either a drain electrode or a source electrode (not shown) of the drive transistor $Tr_1$. The drain electrode or the source electrode of the write transistor $Tr_2$, which is not connected to the signal line DTL is connected to the gate electrode (not shown) of the drive transistor $Tr_1$ and one end of the retention capacitor $C_s$. The drain electrode or the source electrode of the write transistor $Tr_1$, which is not connected to the power line PSL and the other terminal of the retention capacitor $C_s$ are connected to the anode electrode (not shown) of the organic EL element 111. The cathode electrode (not shown) of the organic EL element 111 is connected to, for example, the ground line GND.

Drive Circuit 120

The circuits in the drive circuit 120 will now be described with reference to FIGS. 13 and 14. The drive circuit 120 has a timing generation circuit 121, a video signal processing circuit 122, the signal line drive circuit 123, the write line drive circuit 124, and the power line drive circuit 125.

The timing generation circuit 121 performs control so that the video signal processing circuit 122, the signal line drive circuit 123, the write line drive circuit 124, and the power line drive circuit 125 operate interlockingly. The timing generation circuit 121 outputs, for example, a control signal 121A to the above-described circuits according to (synchronously with) a synchronizing signal 120B which is input from the outside.

The video signal processing circuit 122 performs predetermined correction on the video signal 120A input from the outside and outputs a corrected video signal 122A to the signal line drive circuit 123. Examples of the predetermined correction include gamma correction and overdrive correction.

The signal line drive circuit 123 applies the video signal 122A (signal voltage $V_{sig}$) input from the video signal processing circuit 122 to the signal lines DTL, thereby writing data to the pixel 113 to be selected. The writing refers to application of predetermined voltage to the gate of the drive transistor $Tr_1$.

The signal line drive circuit 123 includes, for example, a shift register (not shown) and has a buffer circuit (not shown) stage by stage in correspondence with each of columns of the pixels 113. The signal line drive circuit 123 outputs two kinds of voltages ($V_{ofs}$ and $V_{sig}$) to the signal lines DTL according to (synchronously with) input of the control signal 121A. Concretely, the signal line drive circuit 123 sequentially supplies two kinds of the voltages ($V_{ofs}$ and $V_{sig}$) to the pixel 113 selected by the write line drive circuit 124 via the signal line DTL connected to the pixels 113.

The offset voltage $V_{ofs}$ has a voltage value lower than that of a threshold voltage $V_{e1}$ of the organic EL element 111. The signal voltage $V_{sig}$ has a voltage value corresponding to the video signal 122A. The minimum voltage of the signal voltage $V_{sig}$ has a voltage value lower than the offset voltage $V_{ofs}$, and the maximum voltage of the signal voltage $V_{sig}$ has a voltage value higher than the offset voltage $V_{ofs}$.

The write line drive circuit 124 includes, for example, a shift register (not shown) and has the buffer circuit 1 or 2 stage by stage in correspondence with each of rows of the pixels 113. The signal line drive circuit 124 outputs two kinds of voltages ($V_{dd}$ and $V_{ss}$) to the write lines WSL according to (synchronously with) input of the control signal 121A. Concretely, the write line drive circuit 124 supplies two kinds of the voltages ($V_{dd}$ and $V_{ss}$) to the pixel 113 to be driven via the write line WSL connected to the pixels 113 to control the write transistor $Tr_2$.

The voltage $V_{dd}$ has a value equal to or larger than on-state voltage of the write transistor $Tr_2$. $V_{dd}$ is a value of voltage output from the write line drive circuit 124 at the time of light-off or threshold correction which will be described later. $V_{ss}$ has a value lower than the on-state voltage of the write transistor $Tr_2$ and lower than $V_{dd}$.

The power line drive circuit 125 includes, for example, a shift register (not shown) and has the buffer circuit (not shown) stage by stage in correspondence with each of rows of the pixels 113. The power line drive circuit 125 outputs two kinds of voltages ($V_{ccH}$ and $V_{ccL}$) according to (synchronously with) input of the control signal 121A. Concretely, the write line drive circuit 125 supplies two kinds of the voltages ($V_{ccH}$ and $V_{ccL}$) to the pixel 113 to be driven via the power line PSL connected to the pixels 113 to control light emission and light-off of the organic EL element 111.

The voltage $V_{ccL}$ has a value lower than voltage ($V_{e1}+V_{ca}$) obtained by adding the threshold voltage $V_{e1}$ of the organic EL element 111 and the voltage $V_{ca}$ of the cathode of the organic EL element 111. $V_{ccH}$ is a value of voltage equal to or larger than the voltage ($V_{e1}+V_{ca}$).

Next, an example of the operation (operation from light-off to light-on) of the display device 100 of the application example will be described. In the application example, the operation of correcting fluctuations in the threshold voltage $V_{th}$ and the mobility μ in order to maintain the light emission luminance of the organic EL element 111 constant without being influenced by the fluctuations even when the threshold voltage $V_{th}$ or mobility μ of the drive transistor $Tr_1$ changes with time.

Figure 15:
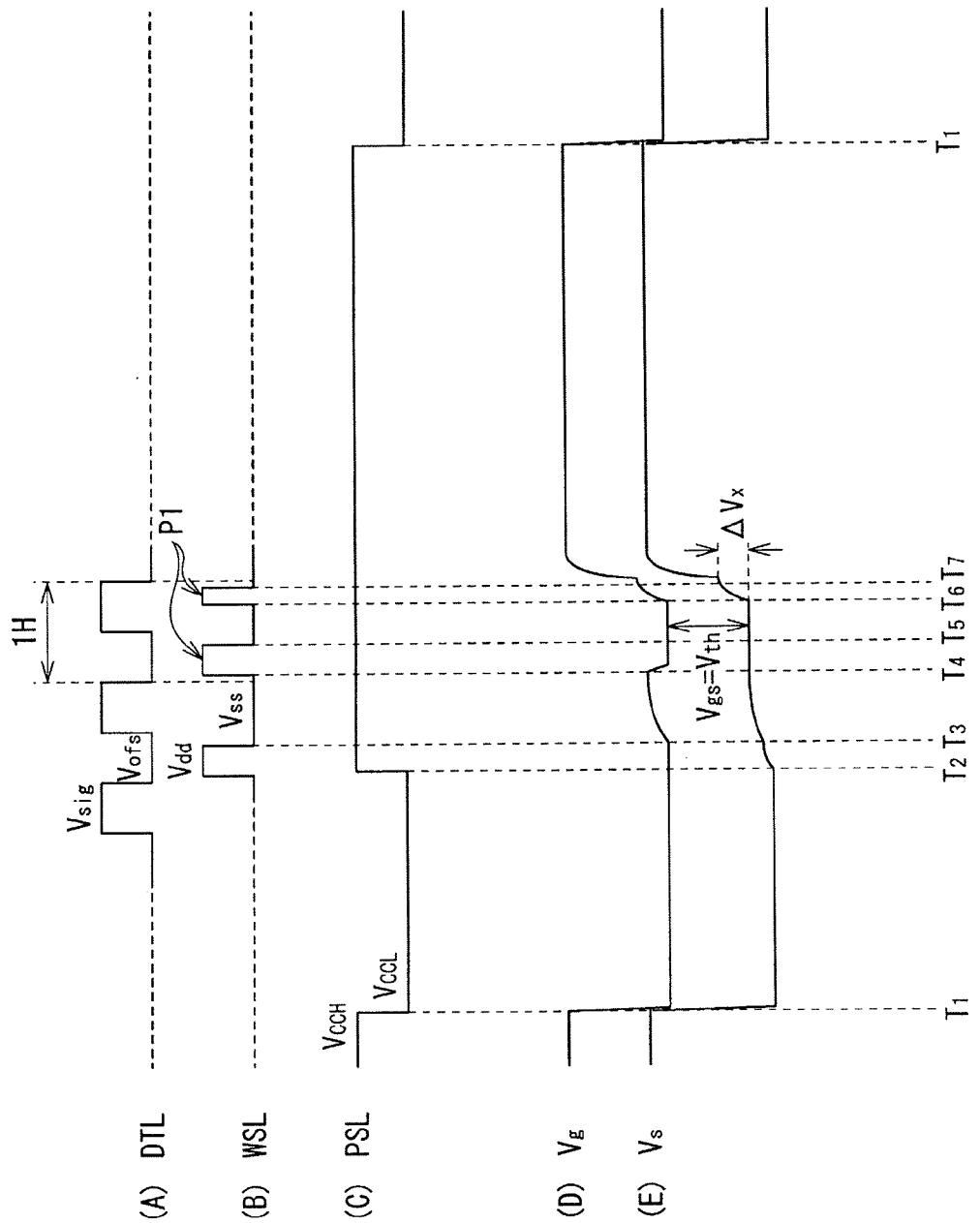
FIG. 15 is a waveform chart expressing an example of operation of the display device of FIG. 13.
Figure 16:
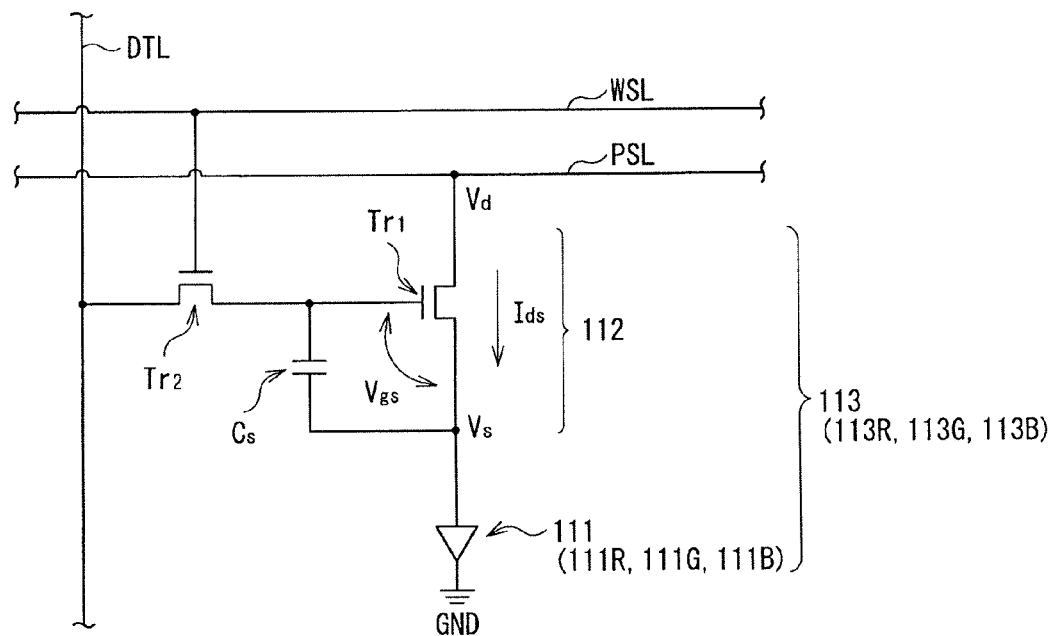
FIG. 16 is a circuit diagram expressing an example of a pixel circuit in a display device of related art.

FIG. 15 expresses an example of the waveforms of voltages applied to the pixel circuit 112 and an example of changes in gate voltage Vg and source voltage Vs of the drive transistor $Tr_1$. (A) in FIG. 15 illustrates a state where the signal voltage $V_{sig}$ and the offset voltage Vas are applied to the signal line DTL. (B) in FIG. 15 illustrates a state where the voltage $V_{dd}$ for turning on the drive transistor $Tr_1$ and the voltage $V_{ss}$ for turning off the drive transistor $Tr_1$ are applied to the write line WSL. (C) in FIG. 15 illustrates a state where the high voltage $V_{ccH}$ and the low voltage $V_{ccL}$ are applied to the power line PSL. Further, (D) and (E) in FIG. 15 illustrate a state where the gate voltage $V_g$ and the source voltage $V_s$ of the drive transistor $Tr_1$ in accordance with the voltage application to the power line PSL, the signal line DTL, and the write line WSL.

$V_{th}$ Correction Preparation Period

First, $V_{th}$ correction is prepared. Concretely, when the voltage of the write line WSL is $V_{off}$, the voltage of the signal line DTL is $V_{sig}$, and the voltage of the power line PSL is $V_{ccH}$ (that is, when the organic EL element 111 emits light), the power supply line drive circuit 125 decreases the voltage in the power supply line DSL from $V_{ccH}$ to $V_{ccL}$ ($T_1$). Accordingly, the source voltage Vs becomes $V_{ccL}$, and the organic EL element 111 is turned off. Next, the signal line drive circuit 123 switches the voltage of the signal line DTL from $V_{sig}$ to $V_{ofs}$ and, while the voltage of the power supply line DSL is equal to $V_{ccH}$, the write line drive circuit 124 increases the voltage of the write line WSL from $V_{off}$ to $V_{on}$. As a result, the gate voltage decreases from $V_g$ to $V_{ofs}$. In the power line drive circuit 125 and the signal line drive circuit 123, the voltages ($V_{ccL}$ and $V_{ofs}$) applied to the power line PSL and the signal line DTL are set so that the gate-source voltage $V_{gs}$ (=$V_{ofs}-V_{ccL}$) becomes larger than the threshold voltage $V_{th}$ of the drive transistor $T_{r1}$.

First $V_{th}$ Correction Period

Next, $V_{th}$ correction is performed. Concretely, during the period in which the voltage of the signal line DTL is equal to $V_{ofs}$, the power line drive circuit 125 increases the voltage of the power line PSL from $V_{ccL}$ to $V_{ccH}$ ($T_2$). The current $I_{ds}$ flows between the drain and source of the drive transistor $T_{r1}$ and the source voltage $V_s$ rises. After that, before the signal line drive circuit 123 switches the voltage of the signal line DTL from $V_{ofs}$ to $V_{sig}$, the write line drive circuit 124 decreases the voltage of the write line WSL from $V_{on}$ to $V_{off}$ ($T_3$). It makes the gate of the drive transistor $T_{r1}$ floated, and the $V_{th}$ correction stops.

First $V_{th}$ Correction Pause Period

During the period in which $V_{th}$ correction pauses, for example, in a row (pixels) different from the row (pixels) subjected to the $V_{th}$ correction, the voltage of the signal line DTL is sampled. At this time, since the source voltage $V_s$ is lower than $V_{ofs}-V_{th}$ in the row (pixels) subjected to the $V_{th}$ correction, also in the $V_{th}$ correction pause period, the current $I_{ds}$ flows between the drain and source of the drive transistor $Tr_1$ in the row (pixels) subjected to the $V_{th}$ correction, the source voltage $V_s$ increases, and the gate voltage $V_g$ also increases due to coupling via the retention capacitor $C_s$.

Second $V_{th}$ Correction Period

Next, $V_{th}$ correction is performed again. Concretely, during the period in which the voltage of the signal line DTL is equal to $V_{ofs}$ and the $V_{th}$ correction is possible, the write line drive circuit 124 increases the voltage of the write line WSL from $V_{off}$ to $V_{on}$ and the gate of the drive transistor $Tr_1$ is set to $V_{ofs}$ ($T_4$). In the case where the source voltage $V_s$ is lower than $V_{ofs}-V_{th}$ (in the case where $V_{th}$ correction has not been completed), the current $I_{ds}$ flows between the drain and source of the drive transistor $Tr_1$ until the drive transistor $Tr_1$ cuts off (until the gate-source voltage $V_{gs}$ becomes $V_{th}$). After that, before the signal line drive circuit 123 switches the voltage of the signal line DTL from $V_{ofs}$ to $V_{sig}$, the write line drive circuit 124 decreases the voltage of the write line WSL from $V_{on}$ to $V_{off}$ ($T_5$). Since the gate of the drive transistor $T_{r1}$ floats, the gate-source voltage $V_{gs}$ is maintained constant regardless of the magnitude of the voltage of the signal line DTL.

In the $V_{th}$ correction period, in the case where the retention capacitor $C_s$ is charged to $V_{th}$ and the gate-source voltage $V_{gs}$ becomes $V_{th}$, the drive circuit 120 finishes the $V_{th}$ correction. However, in the case where the gate-source voltage $V_{gs}$ does not reach $V_{th}$, the drive circuit 120 repeatedly executes the $V_{th}$ correction and the $V_{th}$ correction pause until the gate-source voltage $V_{gs}$ reaches $V_{th}$.

Writing/μ Correction Period

After completion of the $V_{th}$ correction pause period, writing and μ correction is performed. Concretely, during the period in which the voltage of the signal line DTL is equal to $V_{sig}$, the write line drive circuit 124 increases the voltage of the write line WSL from $V_{off}$ to $V_{on}$ ($T_6$) and connects the gate of the drive transistor Tr1 to the signal line DTL. The gate voltage $V_g$ of the drive transistor $Tr_1$ becomes equal to the voltage $V_{sig}$ of the signal line DTL. At this stage, the anode voltage of the organic EL element 111 is still smaller than the threshold voltage $V_{el}$ of the organic EL element 111, and the organic EL element 111 is cut off. Consequently, the current $I_{ds}$ flows in a device capacitor (not shown) in the organic EL element 111, and the device capacitor is charged. The source voltage $V_s$ rises only by $\Delta V_x$ and, eventually, the gate-source voltage $V_{gs}$ becomes $V_{sig}+V_{th}-\Delta V_x$. In such a manner, the μ correction is performed simultaneously with writing. The higher the mobility μ of the drive transistor $Tr_1$ is, the larger $\Delta V_x$ becomes. Therefore, by setting the gate-source voltage $V_{gs}$ to be smaller only by $\Delta V_x$ before light emission, variations in the mobility μ are removed pixel 113 by pixel.

Light Emitting Period

Finally, the write line drive circuit 124 decreases the voltage of the write line WSL from $V_{on}$ to $V_{off}(T_8)$. The gate of the drive transistor $Tr_1$ becomes floating, the current $I_{ds}$ flows between the drain and the source of the drive transistor $Tr_1$, and the source voltage $V_s$ rises. As a result, a voltage equal to or higher than the threshold voltage $V_{el}$ is applied to the organic EL element 111, and the organic EL element 111 emits light with desired luminance.

In the display device 100 of the application example, as described above, the pixel circuit 112 in each pixel 113 is on/off controlled as described above, drive current is injected to the organic EL element 111 in each pixel 113, holes and electrons are recombined, and light emission occurs. The generated light is taken to the outside. As a result, an image is displayed in the display region 110A in the display panel 110.

Figure 17:
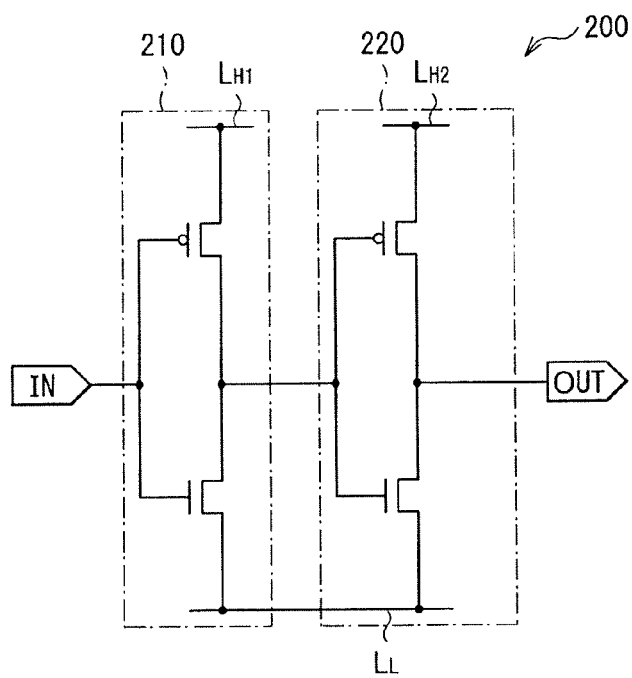
FIG. 17 is a circuit diagram expressing an example of a conventional buffer circuit of related art.
Figure 18:
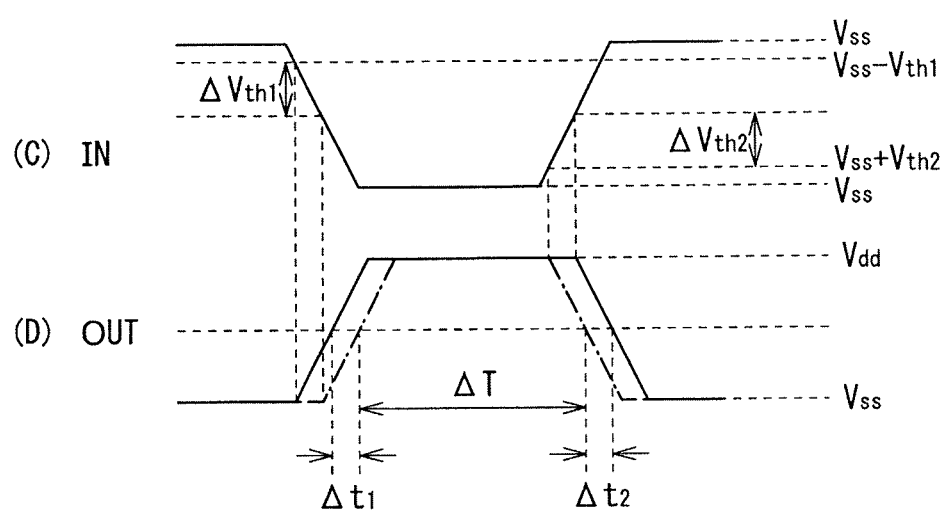
FIG. 18 is a waveform chart expressing an example of the operation of the buffer circuit of FIG. 17.
Figure 19:
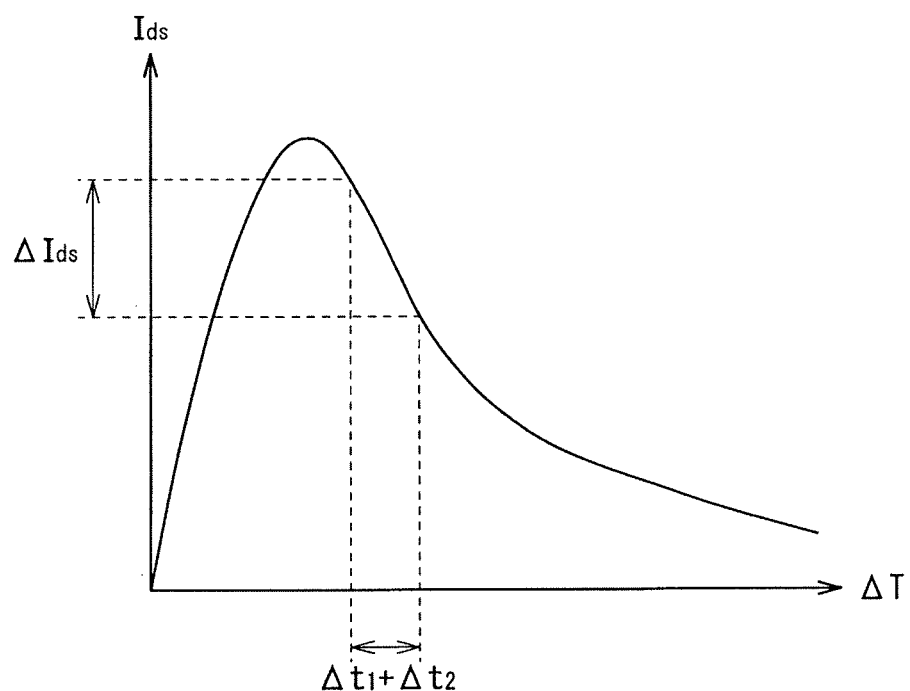
FIG. 19 is a relation diagram expressing an example of the relation between mobility correction time and display luminance.

In the past, in a display device of the active matrix type, a buffer circuit in a scan circuit is typically constructed by connecting two inverter circuits 210 and 220 in series as shown in FIG. 17. In the buffer circuit 200, however, for example, as illustrated in FIG. 18, when the threshold voltage $V_{th1}$ of the MOS transistor of the p-channel type varies only by $\Delta V_{th1}$, the rising timing of the voltage $V_{out}$ of the output OUT shifts only by $\Delta t_1$. In the buffer circuit 200, for example, as illustrated in FIG. 18, when the threshold voltage $V_{th2}$ of the MOS transistor of the n-channel type varies only by $\Delta V_{th2}$, the trailing timing of the voltage $V_{out}$ of the output OUT shifts only by $\Delta t_2$. Therefore, for example, in the case where the rising timing and the trailing timing of the voltage $V_{out}$ of the output OUT vary and the mobility correction period $\Delta T$ varies only by $\Delta_{t1}+\Delta_{t2}$, for example, as shown in FIG. 19, the current $I_{ds}$ at the time of light emission varies only by $\Delta I_{ds}$, and the variation becomes variation in luminance.

On the other hand, in the application example, the buffer circuit 1 or 2 according to the foregoing embodiments is used at an output stage of the write line drive circuit 124. Consequently, the mobility correction period is specified by the pulse width of the output voltage of the buffer circuit 1 or 2, so that variations in the current $I_{ds}$ flowing in the organic EL element 111 at the time of light emission are reduced, and uniformity of luminance is improved.

Although the present invention has been described by the embodiment and the application example, the invention is not limited to the foregoing embodiment but may be variously modified.

For example, in the application example, the buffer circuit 1 or 2 according to the embodiments is used for the output stage of the write line drive circuit 124. The buffer circuit 1 or 2 may be used for the output stage of the power line drive circuit 125 in place of the output stage of the write drive circuit 124, or used for both of the output stage of the write line drive circuit 124 and the output stage of the power line drive circuit 125.

In the foregoing embodiments and the like, it is sufficient that the gate voltage of the transistor $Tr_{22}$ before the threshold correcting operation is lower than $V_{dd}+V_{th1}$ and the gate voltage of the transistor $Tr_{21}$ before the threshold correcting operation is higher than $V_{ss}+V_{th2}$. Therefore, at the time of setting the gate voltage of the transistor $Tr_{22}$ before the threshold correcting operation, a voltage line other than the high-voltage lines $L_H$ and $L_{H2}$ may be used. At the time of setting the gate voltage of the transistor $Tr_{21}$ before the threshold correcting operation, a voltage line other than the low-voltage lines $L_L$ and $L_{L2}$ may be used.

Since the gate voltage of the transistors $Tr_{21}$ and $Tr_{22}$ is retained by the capacitive elements $C_{21}$ and $C_{22}$, in the application example, the threshold correcting operation on the buffer circuits 1 and 2 may be performed once every field or once every few fields. In the case of performing the threshold correcting operation of the buffer circuit 1 or 2 once in every few fields, the number of threshold correcting operations may be reduced, and power consumption may be lowered.

In the foregoing embodiments and the like, the threshold correcting operation is executed until the gate voltage of the transistors $Tr_{21}$ and $Tr_{22}$ becomes stabilized, the threshold correcting operation may be stopped before the gate voltage of the transistors $Tr_{21}$ and $Tr_{22}$ becomes stabilized. For example, during the threshold correcting operation of the transistor $Tr_{21}$, the higher the mobility μ of the transistor $Tr_{21}$ is, the higher the decrease speed of the gate voltage of the transistor $Tr_{21}$ is. Therefore, at some time point in the threshold correcting operation, the higher the mobility μ of the transistor $Tr_{21}$ is, the lower the gate voltage of the transistor $Tr_{21}$ becomes, and the lower the mobility μ of the transistor $Tr_{21}$ is, the higher the gate voltage of the transistor $Tr_{21}$ becomes. When the threshold correcting operation is finished at this time point, the higher the mobility μ of the transistor $Tr_{21}$ is, the narrower the gate-source voltage $V_{gs}$ of the transistor $Tr_{21}$ becomes, and the lower the mobility μ of the transistor $Tr_{21}$ is, the wider the gate-source voltage $V_{gs}$ of the transistor $Tr_{21}$ becomes. That is, by finishing the threshold correcting operation in mid-course, the mobility μ of the transistor $Tr_{21}$ is corrected. The transistor $Tr_{22}$ is similar to the transistor $Tr_{21}$. Therefore, the threshold correcting operation may be finished in mid-course, and the mobility μ of the transistors $Tr_{21}$ and $Tr_{22}$ may be corrected.

The present application contains subject matter related to that disclosed in Japanese Priority Patent Application JP 2009-295550 filed in the Japanese Patent Office on Dec. 25, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A drive circuit comprising an input-side inverter circuit and an output-side inverter circuit connected to each other in series and inserted between a high-voltage line and a low-voltage line,
    wherein the output-side inverter circuit includes:
        a first transistor having a drain connected to a high-voltage line side and a source connected to an output side of the output-side inverter circuit;

a second transistor having a drain connected to a low-voltage line side and a source connected to an output side of the output-side inverter circuit;
a third transistor of which a first of a source or drain is connected to a gate side of the first transistor and of which a second of the source or drain is connected to a source side of the first transistor;
a fourth transistor of which a first of a source or drain is connected to a source side of the first transistor and of which a second of a source or drain is connected to an output side of the output-side inverter circuit;
a first capacitive element of which a first end is connected to a gate side of the first transistor and a second end is connected to an input side of the output-side inverter circuit, and
a correction circuit to correct gate voltage of the first and second transistors;
wherein the correction circuit is configured to set a correction voltage of the first transistor or a voltage corresponding to the correction voltage of the first transistor, for a gate of the first transistor, as an offset voltage to the first transistor, to correct for a threshold voltage in the first transistor, and
wherein the correction circuit also sets a correction voltage of the second transistor or a voltage corresponding to the correction voltage of the second transistor, for a gate of the second transistor, as an offset voltage to the second transistor.

2. The drive circuit according to claim 1, wherein the correction circuit further comprises a fifth transistor of which a first of a source or drain is connected to a gate side of the first transistor and of which a second of the source or drain is connected to a drain side of the second transistor.

3. The drive circuit according to claim 1, wherein the correction circuit further comprises:
a sixth transistor of which a first of a source or drain is connected to a gate side of the second transistor and of which a second of a source or drain is connected to a source side of the second transistor;
a seventh transistor of which a first of a source or drain is connected to a source side of the second transistor and of which a second of the source or drain is connected to an output side of the output-side inverter circuit; and
a second capacitive element of which a first end is connected to a gate side of the second transistor and a second end is connected to an input side of the output-side inverter circuit.

4. The drive circuit according to claim 3, wherein the correction circuit further comprises an eighth transistor of which a first of a source or drain is connected to a gate side of the second transistor and whose source or drain which is not connected to the gate side of the second transistor is connected to a drain side of the first transistor.

5. A display device comprising:
a display section including a plurality of scan lines disposed in rows, a plurality of signal lines disposed in columns, and a plurality of pixels disposed in a matrix; and
a drive section for driving the pixels,
wherein the drive section has a plurality of drive circuits provided for the plurality of scan lines in a one-to-one corresponding manner,
the drive circuit has an input-side inverter circuit and an output-side inverter circuit connected to each other in series and inserted between a high-voltage line and a low-voltage line, and
the output-side inverter circuit includes:
a first transistor whose drain is connected to a high-voltage line side and whose source is connected to an output side of the output-side inverter circuit,
a second transistor whose drain is connected to a low-voltage line side and whose source is connected to an output side of the output-side inverter circuit,
a third transistor of which a first of a source or drain is connected to a gate side of the first transistor and of which a second of the source or drain is connected to a source side of the first transistor;
a fourth transistor of which a first of a source or drain is connected to a source side of the first transistor and of which a second of a source or drain is connected to an output side of the output-side inverter circuit;
a first capacitive element of which a first end is connected to a gate side of the first transistor and a second end is connected to an input side of the output-side inverter circuit, and
a correction circuit to correct gate voltage of the first and second transistors;
wherein the correction circuit is configured to set a correction voltage of the first transistor or a voltage corresponding to the correction voltage of the first transistor, for a gate of the first transistor, as an offset voltage to the first transistor, and
wherein the correction circuit is configured to set a correction voltage of the second transistor or a voltage corresponding to the correction voltage of the second transistor, for a gate of the second transistor as an offset voltage to the second transistor.

* * * * *